United States Patent
Choi et al.

(10) Patent No.: US 11,211,457 B2
(45) Date of Patent: Dec. 28, 2021

(54) SEMICONDUCTOR DEVICE

(71) Applicant: SAMSUNG ELECTRONICS CO., LTD., Suwon-si (KR)

(72) Inventors: Eunhye Choi, Suwon-si (KR); Seung Mo Kang, Seongnam-si (KR); Jungtaek Kim, Seoul (KR); Moon Seung Yang, Hwaseong-si (KR); Jongryeol Yoo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/899,819

(22) Filed: Jun. 12, 2020

(65) Prior Publication Data

US 2020/0395445 A1 Dec. 17, 2020

(30) Foreign Application Priority Data

Jun. 13, 2019 (KR) .................... 10-2019-0070028

(51) Int. Cl.
| | |
|---|---|
| *H01L 29/10* | (2006.01) |
| *H01L 29/08* | (2006.01) |
| *H01L 29/78* | (2006.01) |
| *H01L 29/423* | (2006.01) |
| *H01L 29/66* | (2006.01) |

(52) U.S. Cl.
CPC ........ *H01L 29/105* (2013.01); *H01L 29/0852* (2013.01); *H01L 29/1079* (2013.01); *H01L 29/42356* (2013.01); *H01L 29/66712* (2013.01); *H01L 29/7802* (2013.01)

(58) Field of Classification Search
CPC ............. H01L 29/105; H01L 29/0852; H01L 29/7802; H01L 29/42356; H01L 29/66712; H01L 29/1079; H01L 29/66439; H01L 29/78696; H01L 29/42392; H01L 29/0653; H01L 29/775; H01L 29/161; H01L 29/165; H01L 29/7848; H01L 29/0847; H01L 29/66545; H01L 29/78; H01L 29/0603; H01L 29/0684; H01L 29/0649; H01L 29/66477; B82Y 10/00

See application file for complete search history.

(56) References Cited

U.S. PATENT DOCUMENTS

| | | | |
|---|---|---|---|
| 9,362,355 B1 * | 6/2016 | Cheng | H01L 29/78696 |
| 9,748,335 B1 | 8/2017 | Bentley et al. | |
| 9,923,055 B1 | 3/2018 | Cheng et al. | |
| 9,954,058 B1 * | 4/2018 | Mochizuki | H01L 29/42392 |
| 9,991,261 B2 | 6/2018 | Mitard | |
| 10,141,403 B1 | 11/2018 | Cheng et al. | |
| 10,217,816 B2 | 2/2019 | Bhuwalka et al. | |
| 2018/0301564 A1 * | 10/2018 | Kwon | H01L 21/02603 |
| 2019/0019681 A1 | 1/2019 | Wong et al. | |

(Continued)

*Primary Examiner* — Mohammed R Alam
(74) *Attorney, Agent, or Firm* — Lee IP Law, P.C.

(57) ABSTRACT

A semiconductor device including an insulating layer on a substrate; channel semiconductor patterns stacked on the insulating layer and vertically spaced apart from each other; a gate electrode crossing the channel semiconductor patterns; source/drain regions respectively at both sides of the gate electrode and connected to each other through the channel semiconductor patterns, the source/drain regions having concave bottom surfaces; and air gaps between the insulating layer and the bottom surfaces of the source/drain regions.

20 Claims, 32 Drawing Sheets

(56) References Cited

U.S. PATENT DOCUMENTS

| | | |
|---|---|---|
| 2019/0051535 A1 | 2/2019 | Bi et al. |
| 2019/0051729 A1 | 2/2019 | Zhou |
| 2019/0051734 A1 | 2/2019 | Lin et al. |
| 2019/0058052 A1 | 2/2019 | Frougier et al. |

* cited by examiner

SEMICONDUCTOR DEVICE

CROSS-REFERENCE TO RELATED APPLICATION

Korean Patent Application No. 10-2019-0070028, filed on Jun. 13, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit having metal-oxide-semiconductor field-effect transistors (MOS-FETs). To meet an increasing demand for a semiconductor device with a small pattern size and a reduced design rule, the MOS-FETs may be scaled down.

SUMMARY

The embodiments may be realized by providing a semiconductor device including an insulating layer on a substrate; channel semiconductor patterns stacked on the insulating layer and vertically spaced apart from each other; a gate electrode crossing the channel semiconductor patterns; source/drain regions respectively at both sides of the gate electrode and connected to each other through the channel semiconductor patterns, the source/drain regions having concave bottom surfaces; and air gaps between the insulating layer and the bottom surfaces of the source/drain regions.

The embodiments may be realized by providing a semiconductor device including an insulating layer on a substrate; a first channel semiconductor pattern on the insulating layer and at a first vertical level; a second channel semiconductor pattern stacked on the first channel semiconductor pattern and located at a second vertical level higher than the first vertical level; a gate electrode crossing the first channel semiconductor pattern and the second channel semiconductor pattern; and a source/drain region on a side surface of the gate electrode and connected to the first channel semiconductor pattern and the second channel semiconductor pattern, wherein the source/drain region includes a first semiconductor pattern covering side surfaces of the first channel semiconductor pattern and the second channel semiconductor pattern, and a second semiconductor pattern on the first semiconductor pattern, and a width of the first semiconductor pattern at the first vertical level is larger than a width of the first semiconductor pattern at the second vertical level.

The embodiments may be realized by providing a semiconductor device an insulating layer on a substrate; a first channel stack on the insulating layer; a second channel stack on the insulating layer and spaced apart from the first channel stack in a first direction, each of the first channel stack and the second channel stack including channel semiconductor patterns stacked to be vertically spaced apart from each other; and a source/drain region between the first channel stack and the second channel stack, wherein the source/drain region includes a pair of first semiconductor patterns covering side surfaces of the channel regions and being spaced apart from each other in the first direction, and second semiconductor patterns on the first semiconductor patterns and connecting the pair of first semiconductor patterns to each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
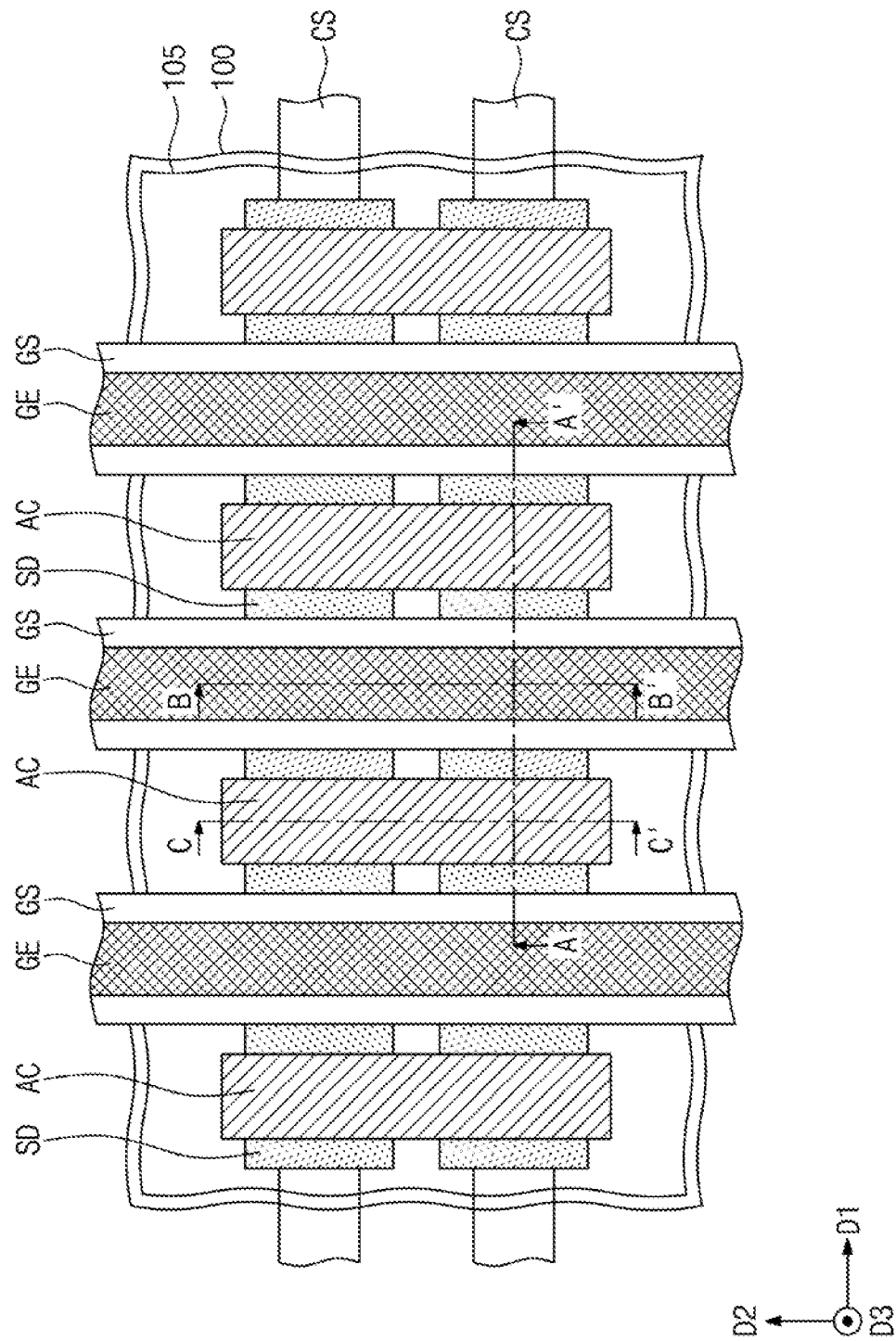
FIG. 1 illustrates a plan view of a semiconductor device according to an embodiment.
Figure 2A:
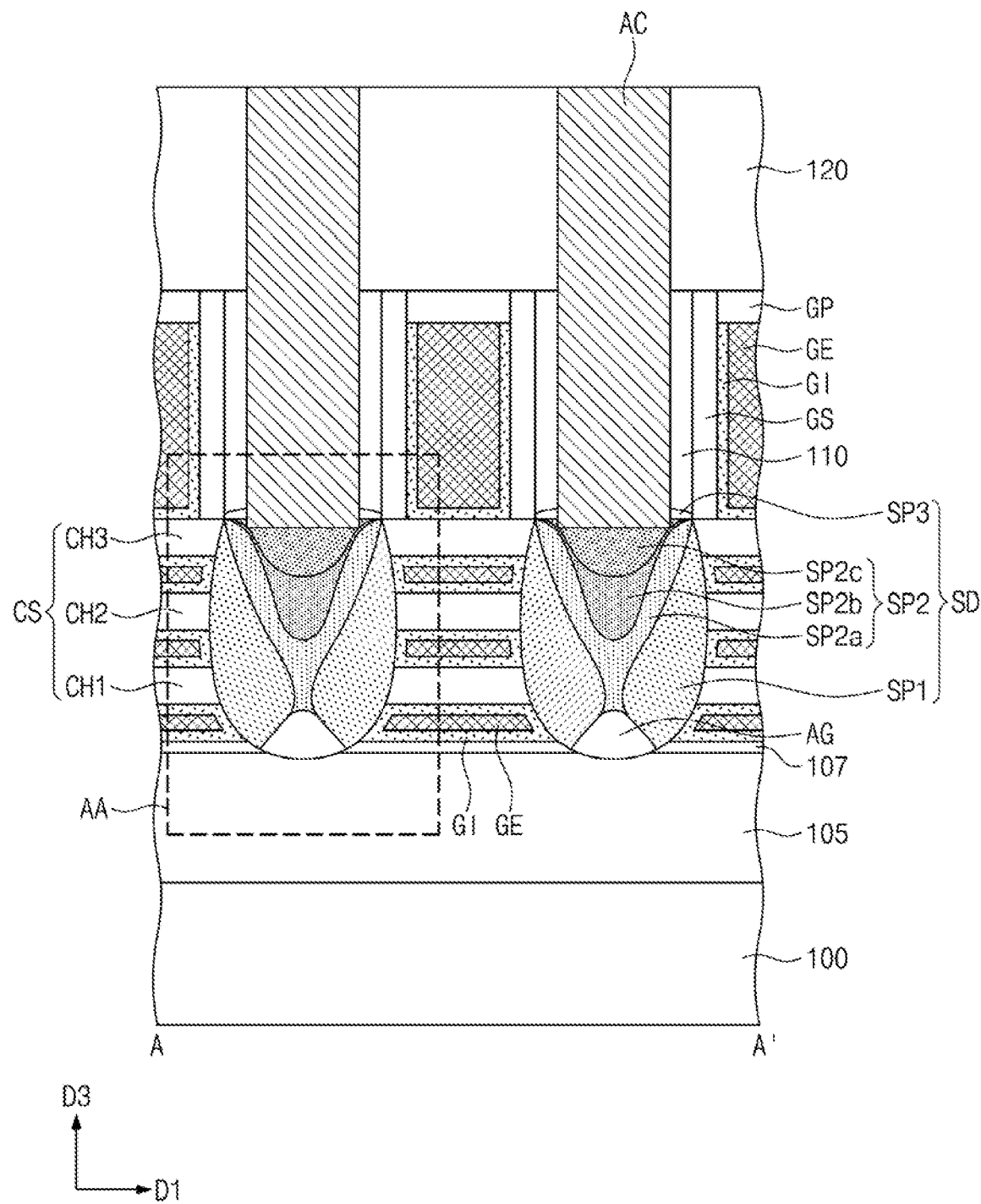
FIGS. 2A to 2C illustrate sectional views taken along lines A-A', B-B', and C-C', respectively, of FIG. 1.
Figure 2B:
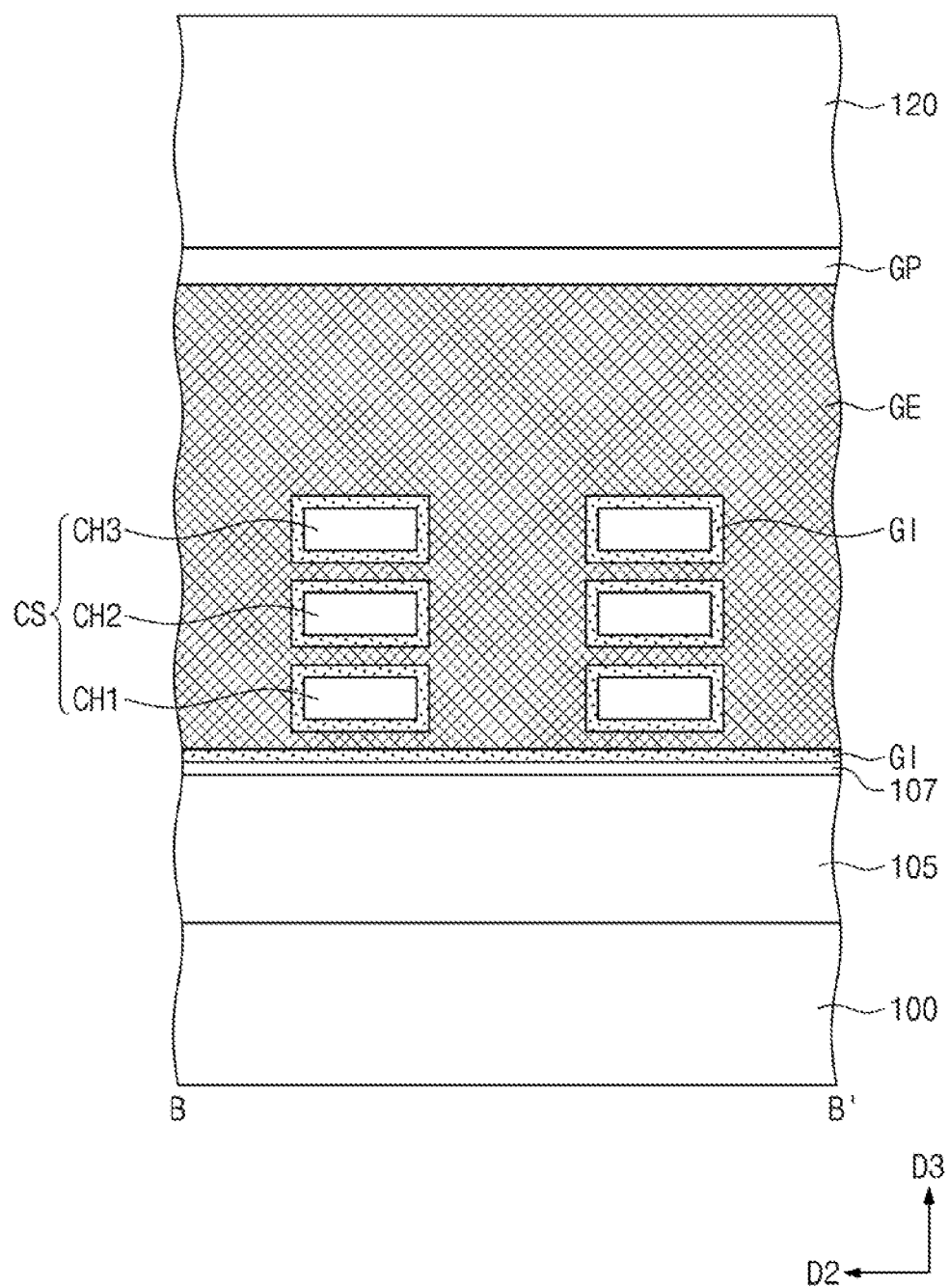
Figure 2C:
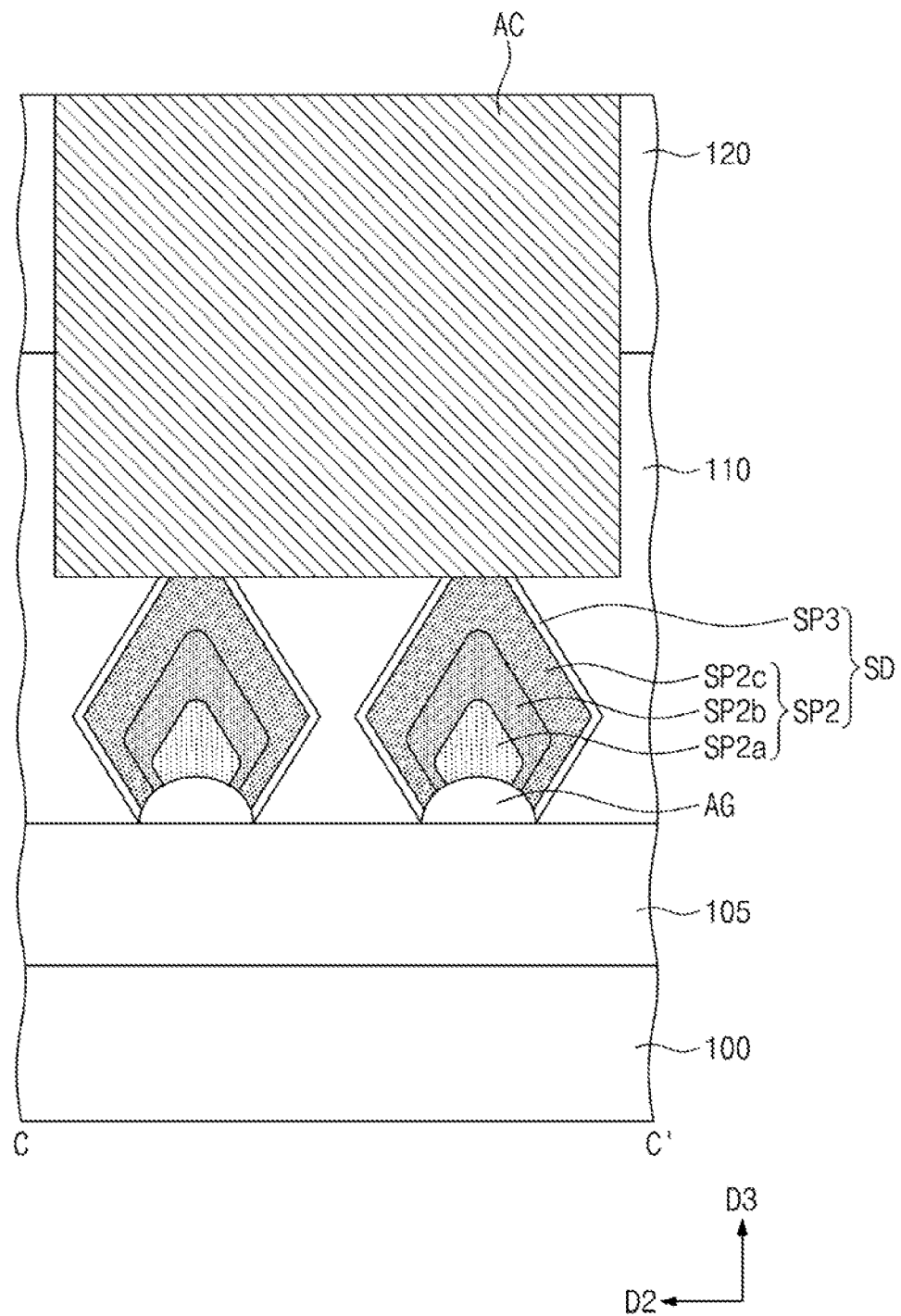

FIG. 1 illustrates a plan view of a semiconductor device according to an embodiment. FIGS. 2A to 2C illustrate sectional views taken along lines A-A', B-B', and C-C', respectively, of FIG. 1.

Referring to FIGS. 1, 2A, 2B, and 2C, an insulating layer 105 may be on a substrate 100. The substrate 100 may be a semiconductor substrate. For example, the substrate 100 may be a silicon substrate or a germanium substrate. The insulating layer 105 may include, e.g., a silicon oxide layer, a silicon nitride layer, or a silicon oxynitride layer. As used herein, the term "or" is not an exclusive term, e.g., "A or B" would include A, B, or A and B. In an implementation, the substrate 100 and the insulating layer 105 may be a part of a silicon-on-insulator (SOI) wafer. For example, the substrate 100 may be a handle substrate of the SOI wafer, and the insulating layer 105 may be an insulator of the SOI wafer.

Channel stacks CS may be on the insulating layer 105. The channel stacks CS may be two-dimensionally arranged (e.g., spaced apart from one another) in a first direction D1 and in a second direction D2 (e.g., perpendicular to the first direction D1). The channel stacks CS may be below gate electrodes GE (e.g., a distance from the substrate 100 to the channel stacks CS in a third direction D3, perpendicular to the first direction D1 and the second direction D2, may be less than a distance from the substrate 100 to the gate electrodes GE), which will be described below. In an implementation, the channel stacks CS may be between a pair of source/drain regions SD. Each of the channel stacks CS may include a plurality of channel semiconductor patterns CH1, CH2, and CH3, which are vertically stacked (e.g., in the third direction D3). The channel semiconductor patterns CH1, CH2, and CH3 included in each channel stack CS may be different from each other in terms of distances from the insulating layer 105 in the third direction D3. In an implementation, the channel semiconductor patterns CH1, CH2, and CH3 may be vertically spaced apart from each other (e.g., in the third direction D3). Each of the channel semiconductor patterns CH1, CH2, and CH3 may be provided in the form of a rectangular parallelepiped nano-sheet. Each of the channel semiconductor patterns CH1, CH2, and CH3 may include a semiconductor material, which may be used as a channel region of a field effect transistor. In an implementation, the channel semiconductor patterns CH1, CH2, and CH3 may be formed of or include, e.g., Si, SiGe, or Ge. The channel semiconductor patterns CH1, CH2, and CH3 may be doped with n- or p-type impurities. In an implementation, as illustrated in FIGS. 2A to 2C, the channel stack CS may include three stacked channel semiconductor patterns CH1, CH2, and CH3. In an implementation, the semiconductor device may include a suitable number of the channel semiconductor patterns in the channel stack CS.

The gate electrodes GE may be on the insulating layer 105. The gate electrodes GE may be arranged (e.g., spaced apart) in the first direction D1. Each of the gate electrodes GE may extend (e.g., lengthwise) in the second direction D2 to cross at least one of the channel stacks CS. For example, each of the gate electrodes GE may extend in the second direction D2 to cross a plurality of the channel stacks CS arranged (e.g., spaced apart) in the second direction D2.

A gate insulating pattern GI may extend along side surfaces (e.g., surfaces facing in the first direction D1 or second direction D3) and bottom surfaces (e.g., substrate 100 facing surfaces) of the gate electrode GE. In an implementation, a gate capping pattern GP may cover the gate electrode GE and the gate insulating pattern GI. Top surfaces (e.g., surfaces facing away from the substrate 100 in the third direction D3) of the gate insulating pattern GI and the gate electrode GE may be in contact with a bottom surface of the gate capping pattern GP. The gate electrode GE and the gate insulating pattern GI may fill spaces between vertically adjacent ones of the channel semiconductor patterns CH1, CH2, and CH3 and between the lowermost channel semiconductor pattern CH1 (e.g., the channel semiconductor pattern CH1 that is closest to the substrate 100 in the third direction D3) and the insulating layer 105. For example, the gate electrode GE and the gate insulating pattern GI may enclose an outer circumference surface of each of the channel semiconductor patterns CH1, CH2, and CH3. In an implementation, each of the channel semiconductor patterns CH1, CH2, and CH3 may penetrate the gate electrodes GE in the first direction D1. Each of the channel semiconductor patterns CH1, CH2, and CH3 may have opposite ends, which respectively protrude from opposite side surfaces of the gate electrodes GE.

The gate electrode GE may be formed of or include, e.g., a doped semiconductor material, a conductive metal nitride, or a metallic material. In an implementation, the gate electrode GE may be formed of or include, e.g., a metal nitride (e.g., TiN, WN, or TaN) or a metallic material (e.g., Ti, W, or Ta). The gate insulating pattern GI may be formed of or include, e.g., silicon oxide, silicon nitride, silicon oxynitride, or a high-k dielectric material. The high-k dielectric materials may include a material (e.g., hafnium oxide (HfO), aluminum oxide (AlO), or tantalum oxide (TaO)), whose dielectric constant is higher than that of silicon oxide. The gate capping pattern GP may be formed of or include, e.g., silicon oxide, silicon nitride, or silicon oxynitride.

Gate spacers GS may be on side surfaces of the gate electrodes GE. The gate spacers GS may extend along the side surfaces of the gate electrodes GE and in the second direction D2. The gate spacer GS may be a single- or multi-layered structure. In an implementation, the gate spacer GS may include, e.g., a silicon nitride layer, a silicon oxynitride layer, or a silicon carbon nitride layer.

The source/drain regions SD may be at both sides of the gate electrode GE. An adjacent pair of the source/drain regions SD may be directly connected to the channel stack CS therebetween. For example, the channel semiconductor patterns CH1, CH2, and CH3 included in each channel stack CS may connect an adjacent pair of the source/drain regions SD to each other. The source/drain regions SD may be epitaxial patterns, which may be formed using the channel semiconductor patterns CH1, CH2, and CH3 as a seed layer.

The source/drain regions SD may exert a strain on the channel semiconductor patterns CH1, CH2, and CH3. The source/drain regions SD may constitute, e.g., a PMOSFET and may include a material exerting a compressive strain on the channel semiconductor patterns CH1, CH2, and CH3. For example, the channel semiconductor patterns CH1, CH2, and CH3 may include a first semiconductor element, and the source/drain regions SD may include a second semiconductor element. A lattice constant of the second semiconductor element may be greater than a lattice constant of the first semiconductor element. In an implementation, the first semiconductor element may be, e.g., silicon (Si). In an implementation, the second semiconductor element may be, e.g., germanium (Ge). The source/drain regions SD may include both of the first and second semiconductor elements. In an implementation, in the case where the channel semiconductor patterns CH1, CH2, and CH3 include silicon, the source/drain regions SD may be formed of or include a SiGe layer whose lattice constant is greater than that of silicon. In an implementation, the conductivity type of the source/drain regions SD may be a p-type.

In an implementation, as shown in FIG. 2C, side surfaces of the source/drain regions SD, which are opposite to each other in the second direction D2, may have a laterally sharp wedge shape. For example, each of the source/drain regions SD may include lower side surfaces, a horizontal distance (e.g., in the second direction D2) between which increases with increasing distance (e.g., in the third direction D3) from the top surface of the insulating layer 105, and upper side surfaces, the horizontal distance between which decreases with increasing distance from the top surface of the insulating layer 105. A bottom surface (e.g., substrate 100 facing surface) of the source/drain region SD may have a concave shape. In an implementation, a lowermost or bottommost surface (e.g., a portion of the source/drain region SD that is closest to the substrate 100 in the third direction D3) of the source/drain region SD may be located at a level (e.g., a distance from the substrate 100 in the third direction D3) that is not lower than (farther from the substrate 100 in the third direction D3 than) an uppermost or topmost surface (e.g., a portion of the insulating layer 105 that is farthest from the substrate 100 in the third direction D3) of the insulating layer 105. In an implementation, facing side surfaces of the source/drain regions SD, which are adjacent to each other in the second direction D2, may be spaced apart from each other. In an implementation, the facing side surfaces of the source/drain regions SD, which are adjacent to each other, may be connected to each other.

Figure 3:
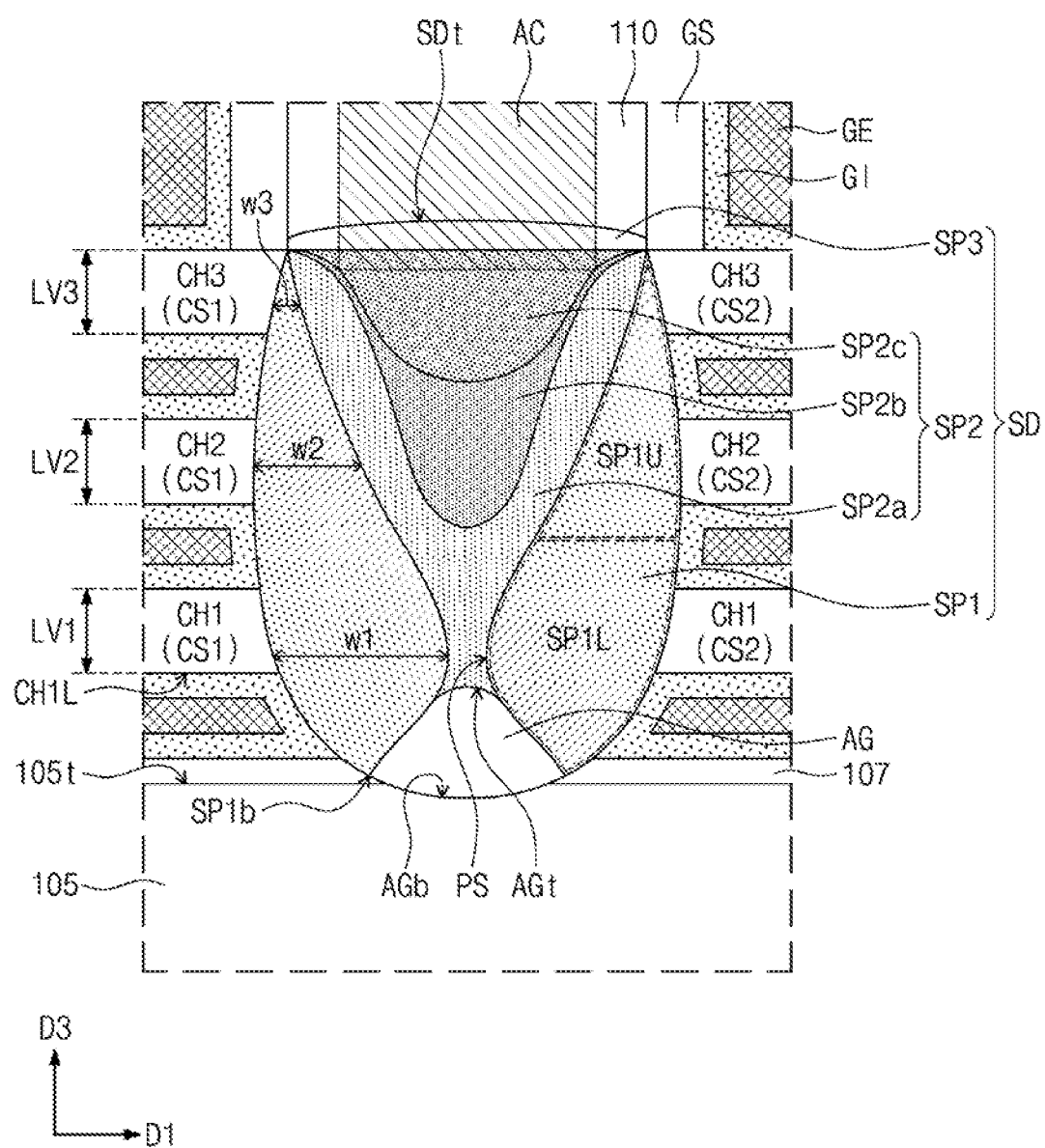
FIG. 3 illustrates an enlarged sectional view of a portion (e.g., AA of FIG. 2A) of a semiconductor device according to an embodiment.

Air gaps AG may be between the insulating layer 105 and the source/drain regions SD. The air gap AG may be a region, which is not filled with a solid material, and may be substantially an empty space. The air gap AG may be defined by the top surface of the insulating layer 105 and the concave bottom surface of the source/drain region SD. Referring further to FIG. 3, a topmost portion AGt of the air gap AG may be located at a level lower than (e.g., closer to the substrate 100 in the third direction D3 than) a bottom surface CH1L of the first channel semiconductor pattern CH1, which is one of the vertically-stacked channel semiconductor patterns CH1, CH2, and CH3 closest (e.g., in the third direction D3) to the insulating layer 105. For example, the strain exerted on the first channel semiconductor pattern CH1 may not be reduced by the air gap AG. A bottommost portion AGb of the air gap AG may be located at a level that is lower (e.g., closer to the substrate 100 in the third direction D3) than a topmost surface 105t of the insulating layer 105.

The source/drain region SD may include a first semiconductor pattern SP1, a second semiconductor pattern SP2, and a third semiconductor pattern SP3, which are sequentially formed.

The first semiconductor pattern SP1 may be a buffer layer, and may be between the channel stack CS and the second semiconductor pattern SP2 (e.g., in the first direction D1). A content of germanium (Ge) in the first semiconductor pattern SP1 may be relatively low. In an implementation, a content of germanium (Ge) in the first semiconductor pattern SP1 may be, e.g., 5 at % to 15 at %. A content of germanium (Ge) in the second semiconductor pattern SP2 may be higher than the content of germanium (Ge) in the first semiconductor pattern SP1. In an implementation, the content of germanium (Ge) in the second semiconductor pattern SP2 may be, e.g., 20 at % to 60 at %.

In an implementation, the third semiconductor pattern SP3 may be a capping layer to protect the second semiconductor pattern SP2. The third semiconductor pattern SP3 may include the same semiconductor element as the substrate 100. In an implementation, the third semiconductor pattern SP3 may include single crystalline silicon (Si). A concentration of silicon (Si) of the third semiconductor pattern SP3 may be, e.g., about 90 at % to about 100 at %.

In an implementation, the second semiconductor pattern SP2, which is one of the semiconductor patterns of the source/drain region SD, may have the highest germanium concentration and may have the largest volume (e.g., among the semiconductor patterns of the source/drain region SD). For example, the source/drain regions SD may exert a strong strain on the channel stack CS, which is on the side surface thereof.

FIG. 3 illustrates an enlarged sectional view of a portion (e.g., AA of FIG. 2A) of a semiconductor device according to an embodiment.

For example, referring to FIG. 3, the source/drain pattern SD may be between a first channel stack CS1 and a second channel stack CS2, which are spaced apart from each other in the first direction D1. Each of the first channel stack CS1 and the second channel stack CS2 may include the first to third channel semiconductor patterns CH1, CH2, and CH3, which are stacked to be vertically spaced apart from each other. The first to third channel semiconductor patterns CH1, CH2, and CH3 may be located at first to third vertical levels LV1, LV2, and LV3, respectively. The source/drain pattern SD may cover side surfaces of the first to third channel semiconductor patterns CH1, CH2, and CH3. A topmost portion SDt of the source/drain pattern SD may be located at a level higher than the top surface of the third channel semiconductor pattern CH3 (e.g., a distance from the substrate 100 to the topmost portion SDt of the source/drain pattern SD in the third direction D3 may be greater than a distance from the substrate 100 to the top surface of the third channel semiconductor pattern CH3 in the third direction D3). A bottommost portion SP1b of the source/drain pattern SD may be located at a level, which is lower than the bottom surface CH1L of the first channel semiconductor pattern CH1 but is not lower than the topmost surface 105t of the insulating layer 105 (e.g., a distance from the substrate 100 to the bottommost portion SP1b of the source/drain pattern SD in the third direction D3 may be less than a distance from the substrate 100 to the bottom surface CH1L of the first channel semiconductor pattern CH1 in the third direction D3 and may be greater than a distance from the substrate 100 to the topmost surface 105t of the insulating layer 105 in the third direction D3).

A pair of the first semiconductor patterns SP1 may cover the side surface of the first channel stack CS1 and the side surface of the second channel stack CS2. The pair of the first semiconductor patterns SP1 may have shapes, which are symmetric to each other in the first direction D1 (e.g., about a line or plane bisecting the source/drain region SD in the third direction D3). Each of the pair of the first semiconductor patterns SP1 may include an upper portion SP1U and a lower portion SP1L. A width of the lower portion SP1L in the first direction D1 may be larger than a width of the upper portion SP1U in the first direction D1. The widths of the upper portions SP1U of the first semiconductor patterns SP1, which are measured in the first direction D1, may increase with decreasing distance from the lower portion SP1L (e.g., closer to the lower portion SP1L). Each of the lower portions SP1L of the first semiconductor patterns SP1 may include a protruding portion PS, which protrudes toward another of the first semiconductor patterns SP1 adjacent thereto. The width of the lower portion SP1L of the first semiconductor pattern SP1, which is measured in the first direction D1, may decrease with increasing distance from the vertical level of the protruding portion PS (e.g., the lower portion SP1L of the first semiconductor pattern SP1 may have a maximum width in the first direction at the protruding portion PS thereof).

The first semiconductor pattern SP1 may have a first width w1 (e.g., in the first direction D1) at the first vertical level LV1, at which the first channel semiconductor pattern CH1 is positioned. The first semiconductor pattern SP1 may have a second width w2 (e.g., in the first direction D1) at the second vertical level LV2, at which the second channel semiconductor pattern CH2 is positioned. The first semiconductor pattern SP1 may have a third width w3 (e.g., in the first direction D1) at the third vertical level LV3, at which the third channel semiconductor pattern CH3 is positioned. The first width w1 may be larger than the second width w2, and the second width w2 may be larger than the third width w3.

The second semiconductor pattern SP2 may be on a pair of the first semiconductor patterns SP1 to connect the pair of the first semiconductor patterns SP1 to each other. A bottom surface of the second semiconductor pattern SP2 may be located at a level lower than the protruding portion PS of the first semiconductor pattern SP1. The second semiconductor pattern SP2, along with the first semiconductor pattern SP1 and the insulating layer 105 (and, e.g., a lower semiconductor layer 107, described below), may define the air gap AG. The topmost portion AGt of the air gap AG may be defined by the bottom surface of the second semiconductor pattern SP2. The topmost portion AGt of the air gap AG may be located at a level lower than the bottom surface CH1L of the first channel semiconductor pattern CH1.

The second semiconductor pattern SP2 may include a first sub-semiconductor pattern SP2a, a second sub-semiconductor pattern SP2b, and a third sub-semiconductor pattern SP2c, which are sequentially formed. The second sub-semiconductor pattern SP2b may cover a surface of the first sub-semiconductor pattern SP2a. The third sub-semiconductor pattern SP2c may cover a surface of the second sub-semiconductor pattern SP2b. In an implementation, a content of germanium (Ge) in the first sub-semiconductor pattern SP2a may be, e.g., 20 at % to 30 at %, a content of germanium (Ge) in the second sub-semiconductor pattern SP2b may be, e.g., 35 at % to 45 at %, and a content of germanium (Ge) in the third sub-semiconductor pattern SP2c may be, e.g., 50 at % to 60 at %. The third semiconductor pattern SP3 may cover a surface of the third sub-semiconductor pattern SP2c.

A first interlayered insulating layer 110 may be on a top surface of the substrate 100. The first interlayered insulating layer 110 may cover the insulating layer 105, the gate spacers GS, and the source/drain regions SD. The first interlayered insulating layer 110 may have a top surface, which is substantially coplanar with the top surface of the gate capping pattern GP. A second interlayered insulating layer 120 may be on the first interlayered insulating layer 110. In an implementation, the first and second interlayered insulating layers 110 and 120 may be formed of or include, e.g., a silicon oxide layer or a silicon oxynitride layer.

Active contacts AC may penetrate the first and second interlayered insulating layers 110 and 120 and may be connected to the source/drain regions SD. In an implementation, the active contacts AC may be formed of or include a metallic material (e.g., titanium, tantalum, tungsten, copper, or aluminum).

Figure 4:
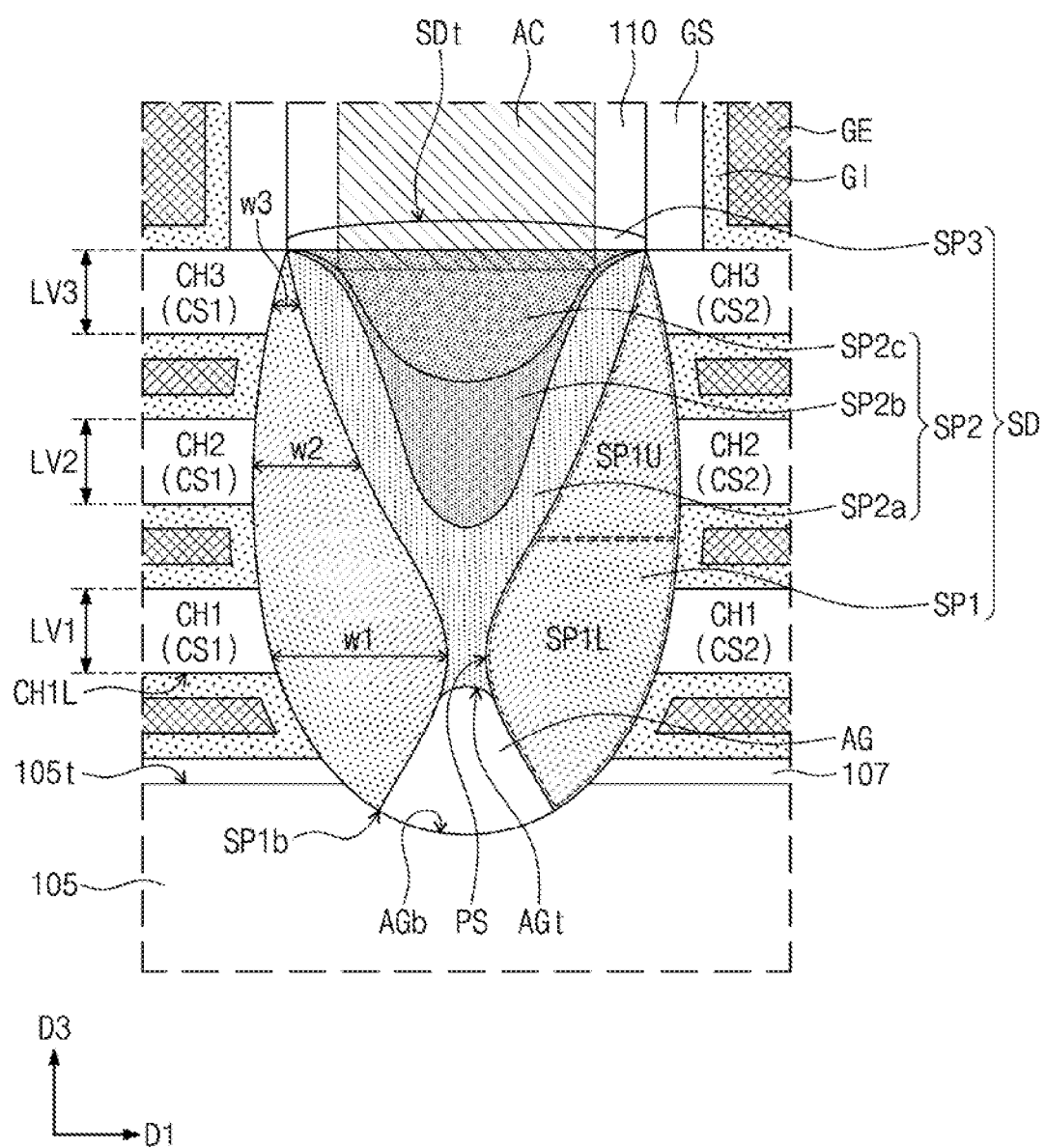
FIGS. 4 and 5 illustrate enlarged sectional views of a portion (e.g., AA of FIG. 2A) of a semiconductor device according to an embodiment.
Figure 5:
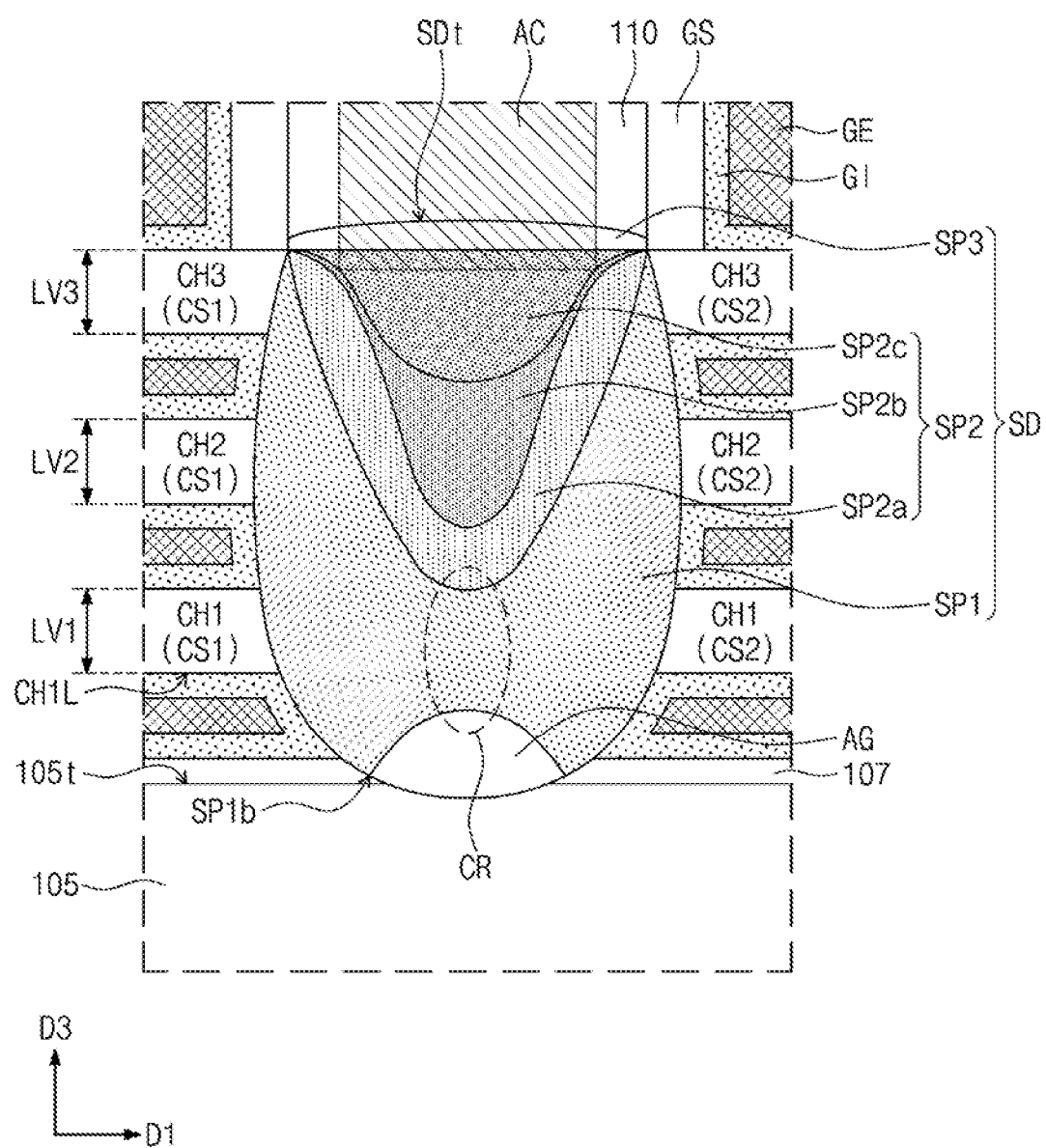

FIGS. 4 and 5 illustrate enlarged sectional views of a portion (e.g., AA of FIG. 2A) of a semiconductor device according to an embodiment.

Referring to FIG. 4, a lower portion of the first semiconductor pattern SP1 may convexly protrude toward the air gap AG, e.g., the air gap AG may have concave upper side surfaces. The bottommost portion SP1L of the first semiconductor pattern SP1 (e.g., the bottommost portion of the source/drain region SD) may be located at level lower than the topmost surface 105t of the insulating layer 105.

Referring to FIG. 5, the pair of the first semiconductor patterns SP1 described above may be connected to each other to form a single object or structure. A connecting portion CR may connect a portion of the first semiconductor pattern SP1 on the side surface of the first channel stack CS1 to another portion of the first semiconductor pattern SP1 on the side surface of the first channel stack CS1. For example, the first semiconductor pattern SP1 may cover the side surface of the first channel stack CS1 and the side surface of the second channel stack CS2, and the bottom and top surfaces of the first semiconductor pattern SP1 may have concave shapes. The topmost portion AGt of the air gap AG may be defined by the bottom surface of the first semiconductor pattern SP1.

FIGS. 6, 7, 8A, and 8B illustrate sectional views of a semiconductor device according to an embodiment, taken along a line C-C' of FIG. 1.

Figure 6:
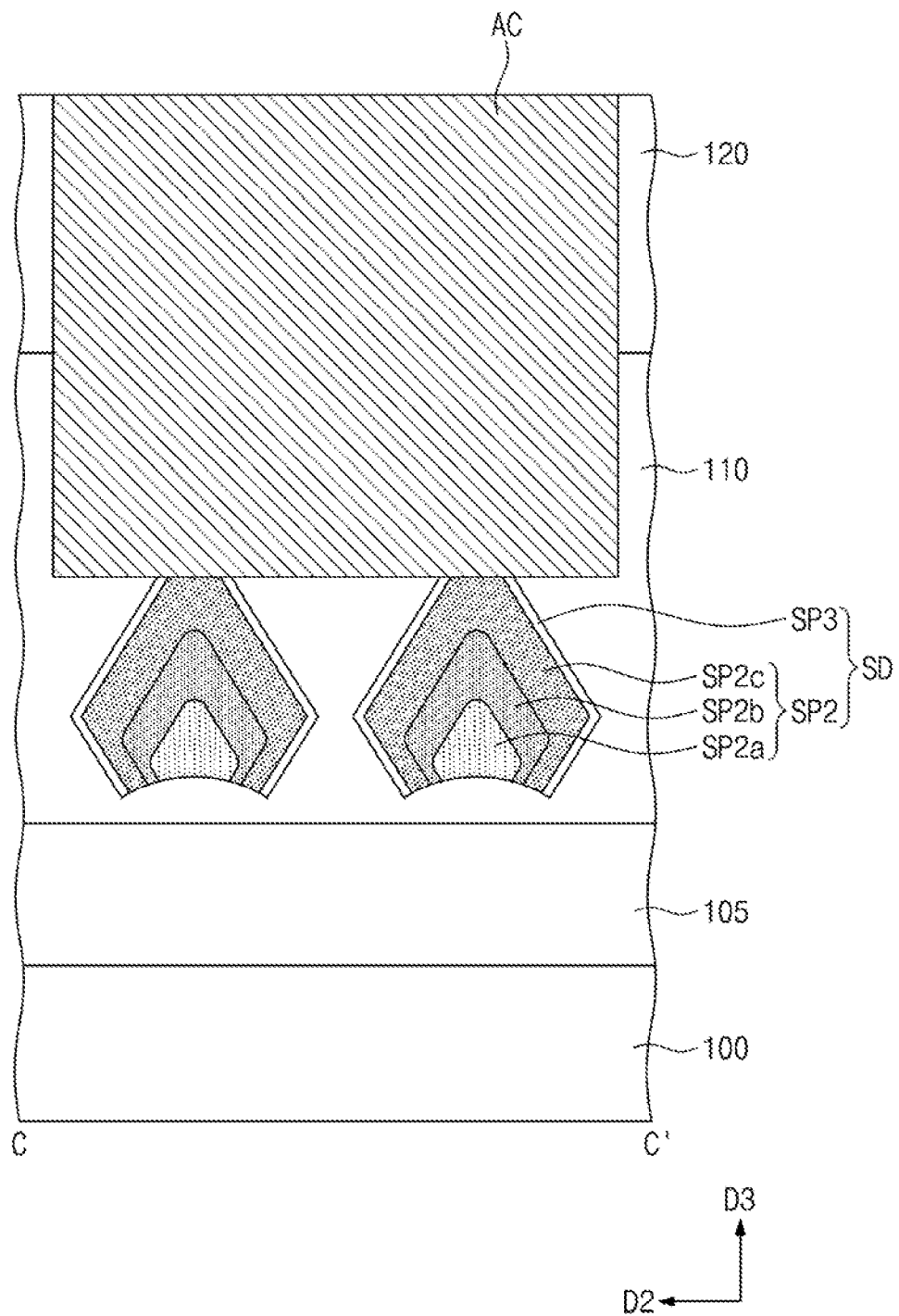
FIGS. 6, 7, 8A, and 8B illustrate sectional views of a semiconductor device according to an embodiment, taken along a line C-C' of FIG. 1.

Referring to FIG. 6, the source/drain regions SD may be spaced apart from the insulating layer 105. In an implementation, a region between the source/drain regions SD and the insulating layer 105 may be filled with the first interlayered insulating layer 110. For example, the bottom surfaces of the source/drain regions SD may be covered with the first interlayered insulating layer 110. The first interlayered insulating layer 110 may be in contact with the bottom surface of the second semiconductor pattern SP2.

Figure 7:
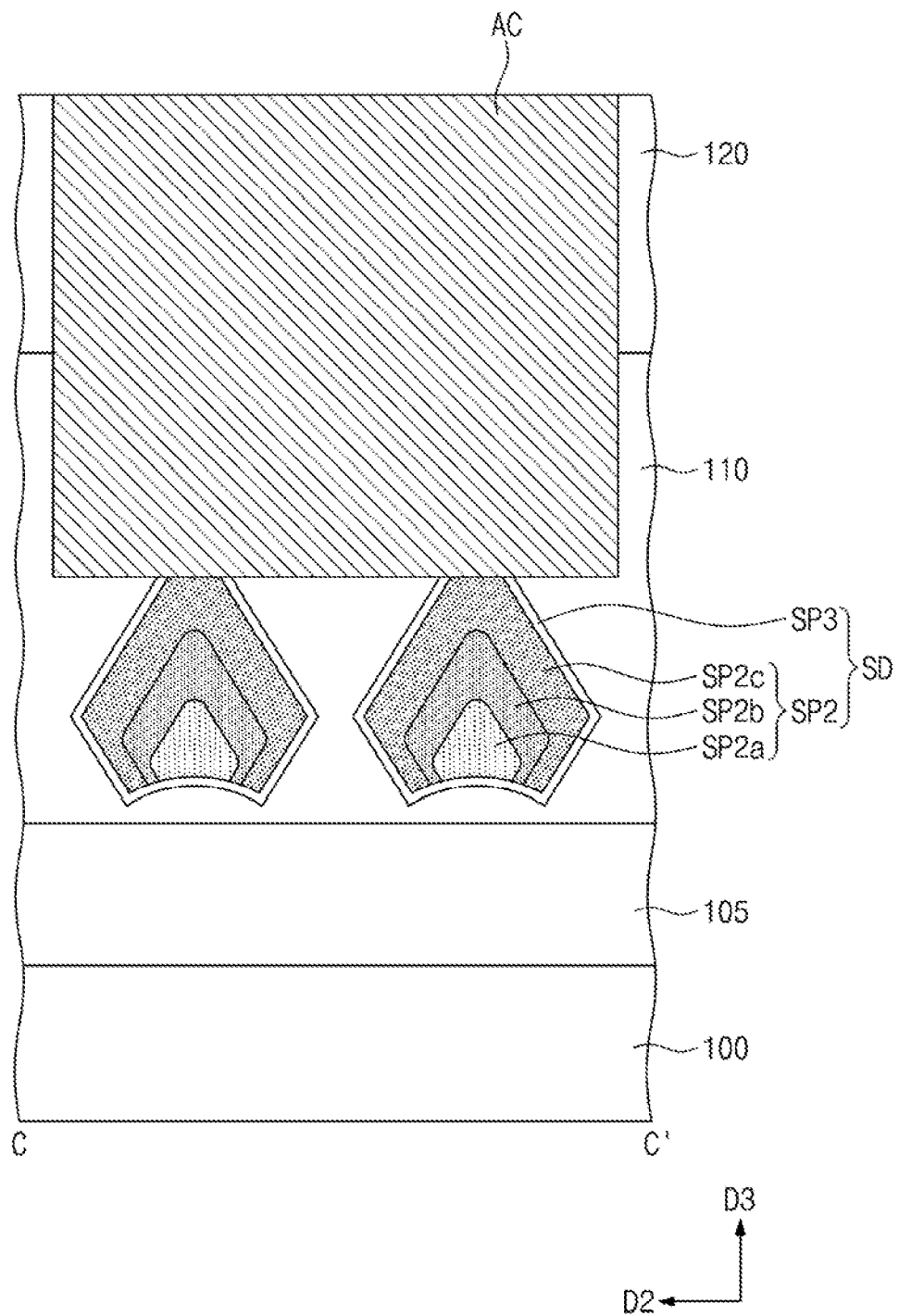

Referring to FIG. 7, the source/drain regions SD may be spaced apart from the insulating layer 105, and the third semiconductor pattern SP3 may surround the second semiconductor pattern SP2. For example, the bottom surface of the second semiconductor pattern SP2 may be covered with the third semiconductor pattern SP3 and thus may not be exposed (e.g., to the first interlayered insulating layer 110).

Figure 8A:
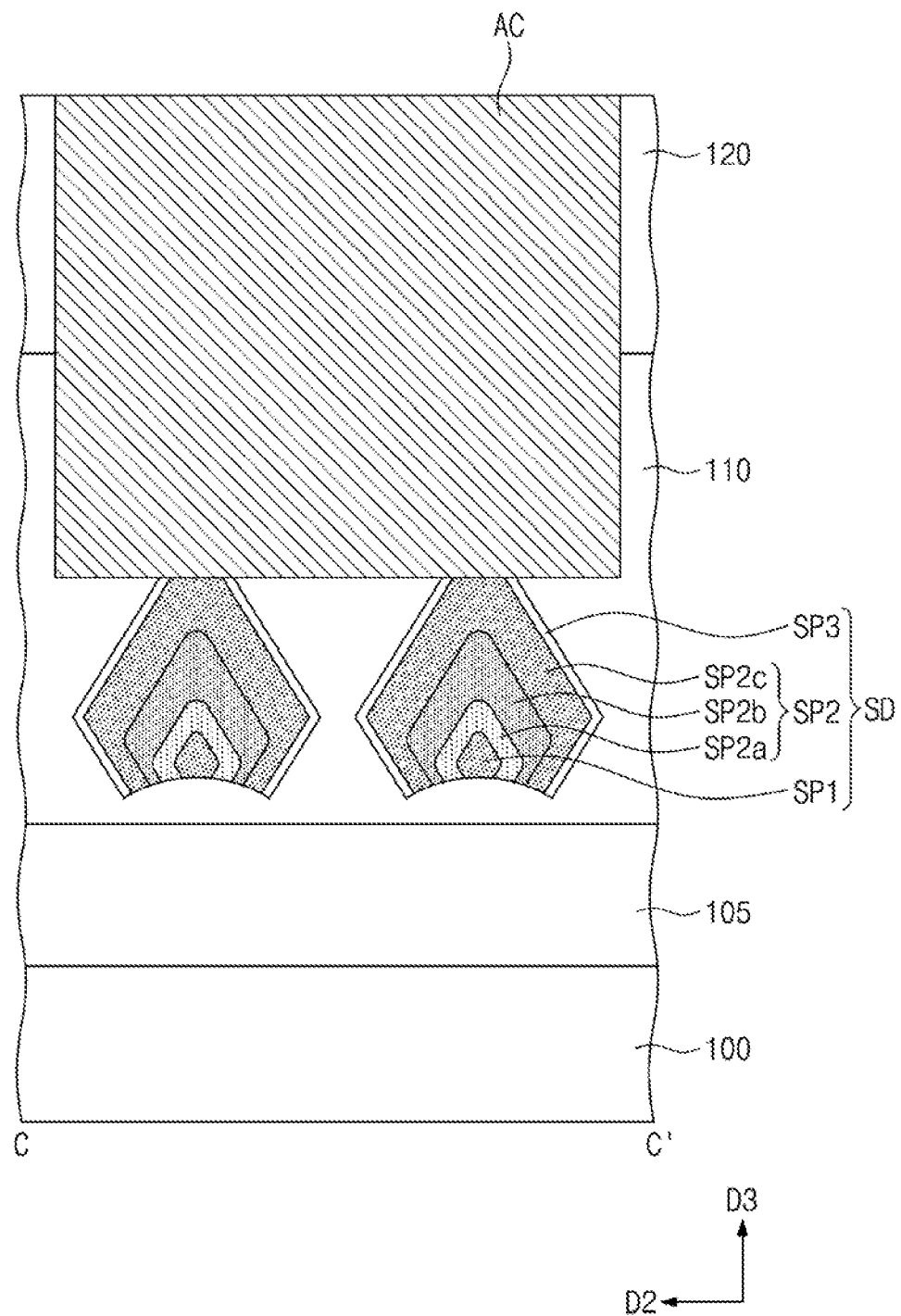
Figure 8B:
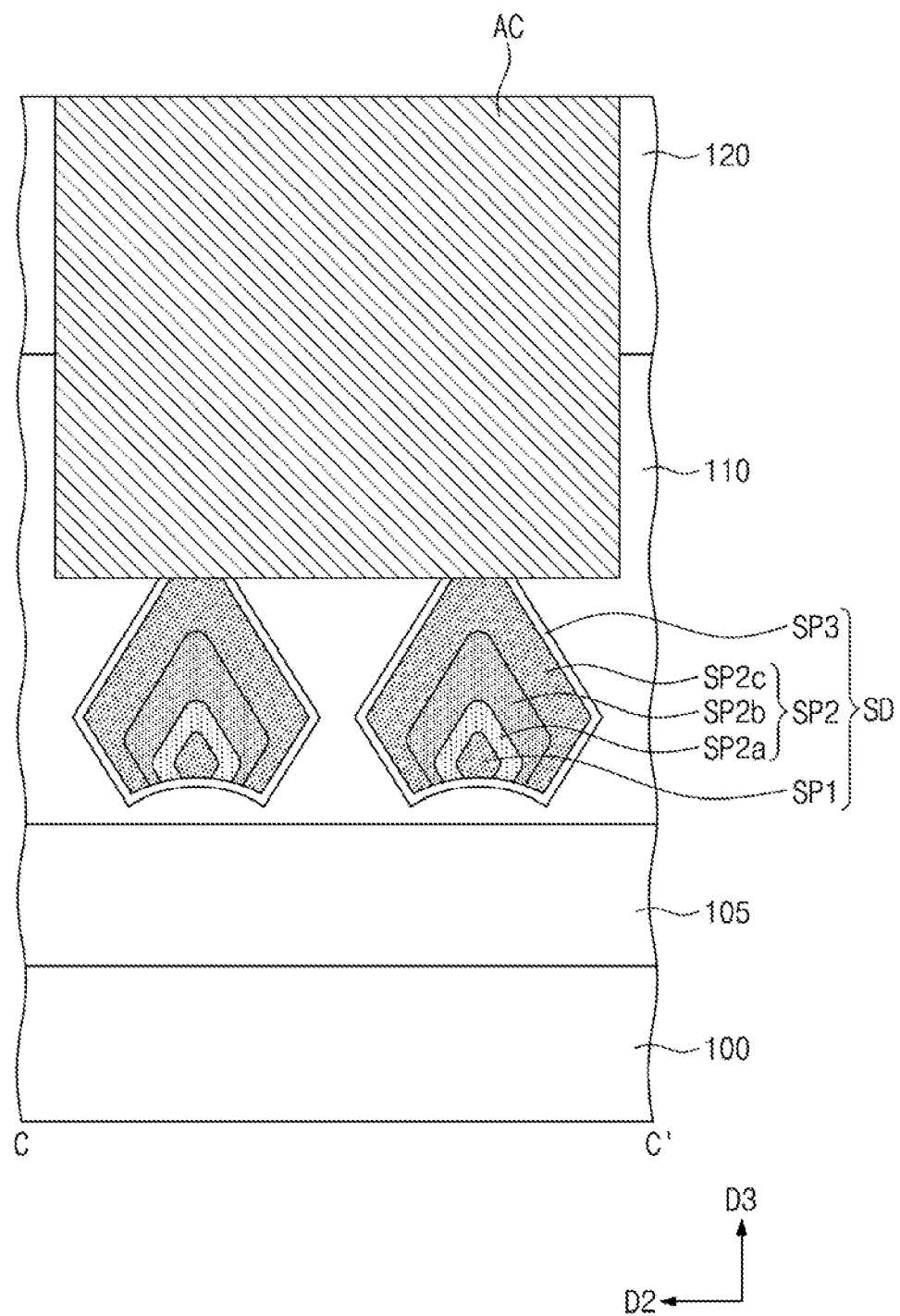

Referring to FIGS. 8A and 8B in conjunction with FIG. 5, the first semiconductor pattern SP1 on the first channel stack CS1 and the first semiconductor pattern SP1 on the second channel stack CS2 may be connected to each other to form a single object or structure. For example, a portion of the surface of the first semiconductor pattern SP1 may be covered with the second semiconductor pattern SP2. In an implementation, as shown in FIG. 8A, another portion (e.g., a bottom surface) of the surface of the first semiconductor pattern SP1 may be covered with the first interlayered insulating layer 110. In an implementation, as shown in FIG. 8B, the bottom surface of the first semiconductor pattern SP1 and the bottom surface of the second semiconductor pattern SP2 may be covered with the third semiconductor pattern SP3.

Hereinafter, a method of fabricating a semiconductor device, according to an embodiment, will be described in more detail with reference to the accompanying drawings.

Figure 14A:
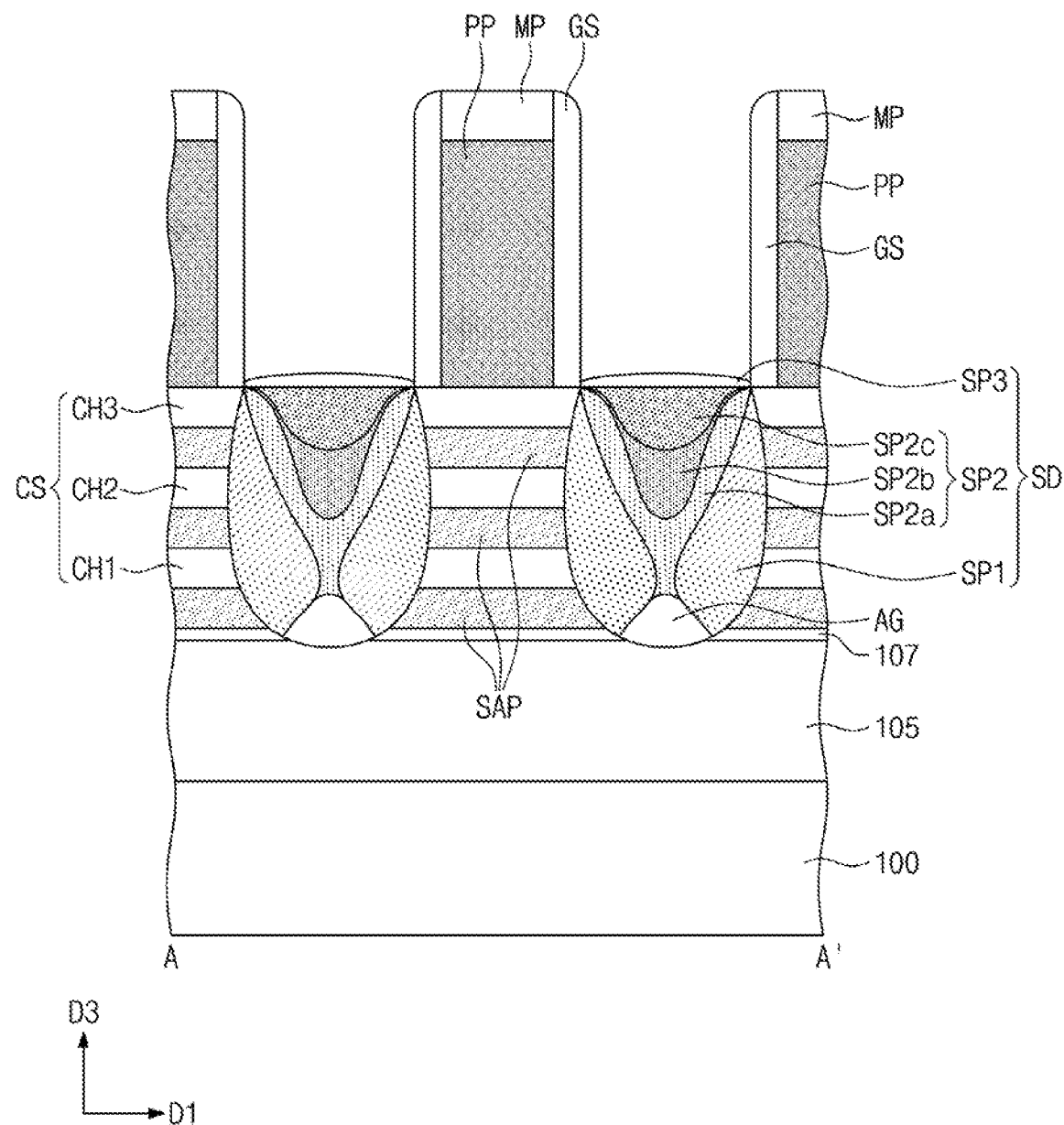
Figure 14B:
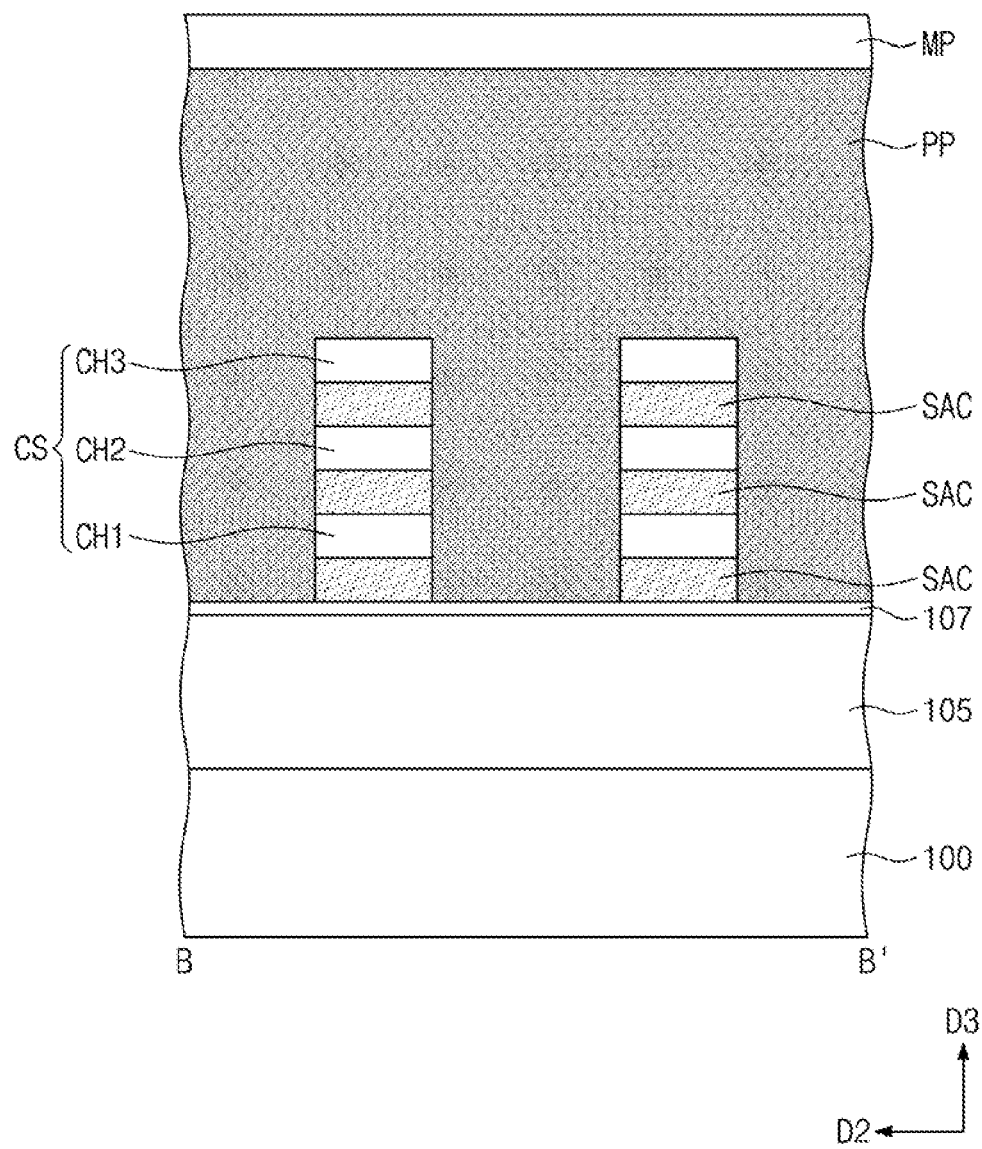
Figure 14C:
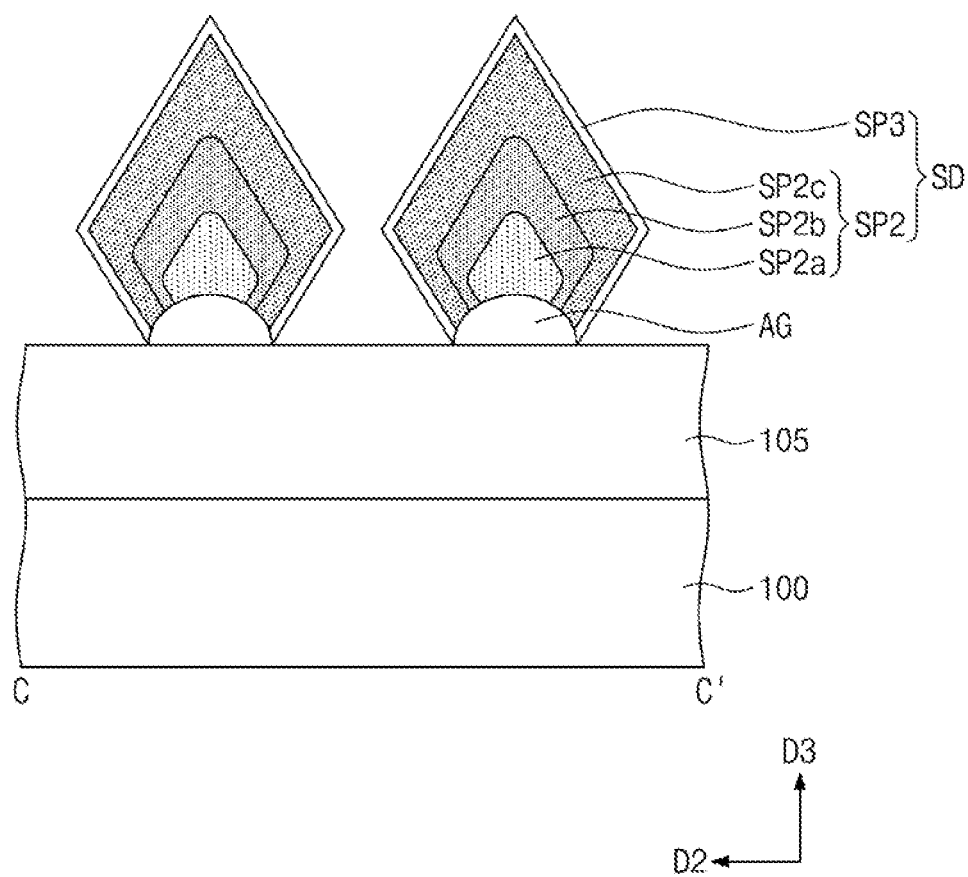
FIGS. 14C, 19C, and 21C illustrate sectional views taken along lines C-C' of FIGS. 13, 18, and 20, respectively.
Figure 15:
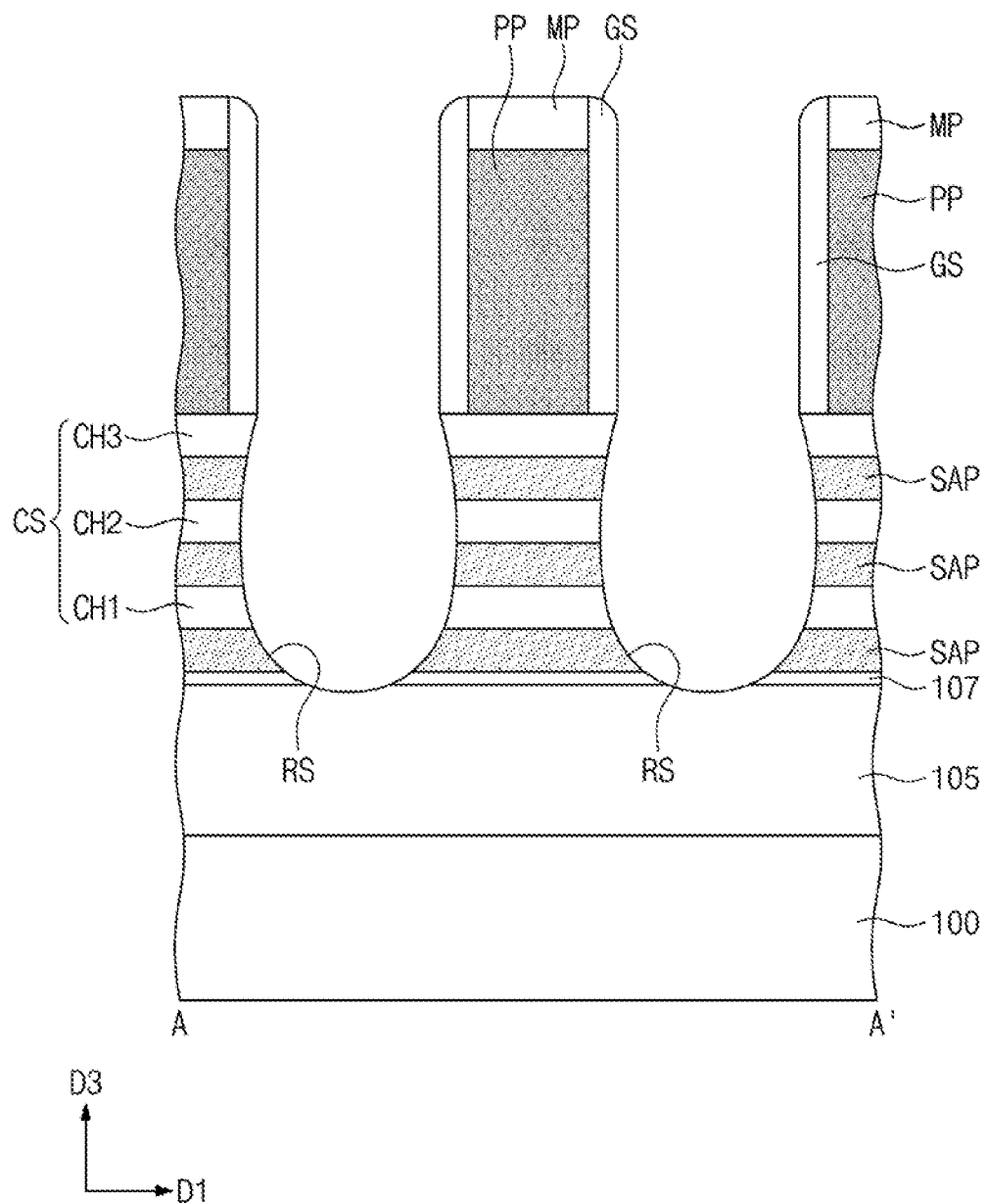
FIGS. 15 to 17 illustrate sectional views, which are taken along a line A-A' of FIG. 13, of stages in a method of forming source/drain patterns, according to an embodiment.
Figure 16:
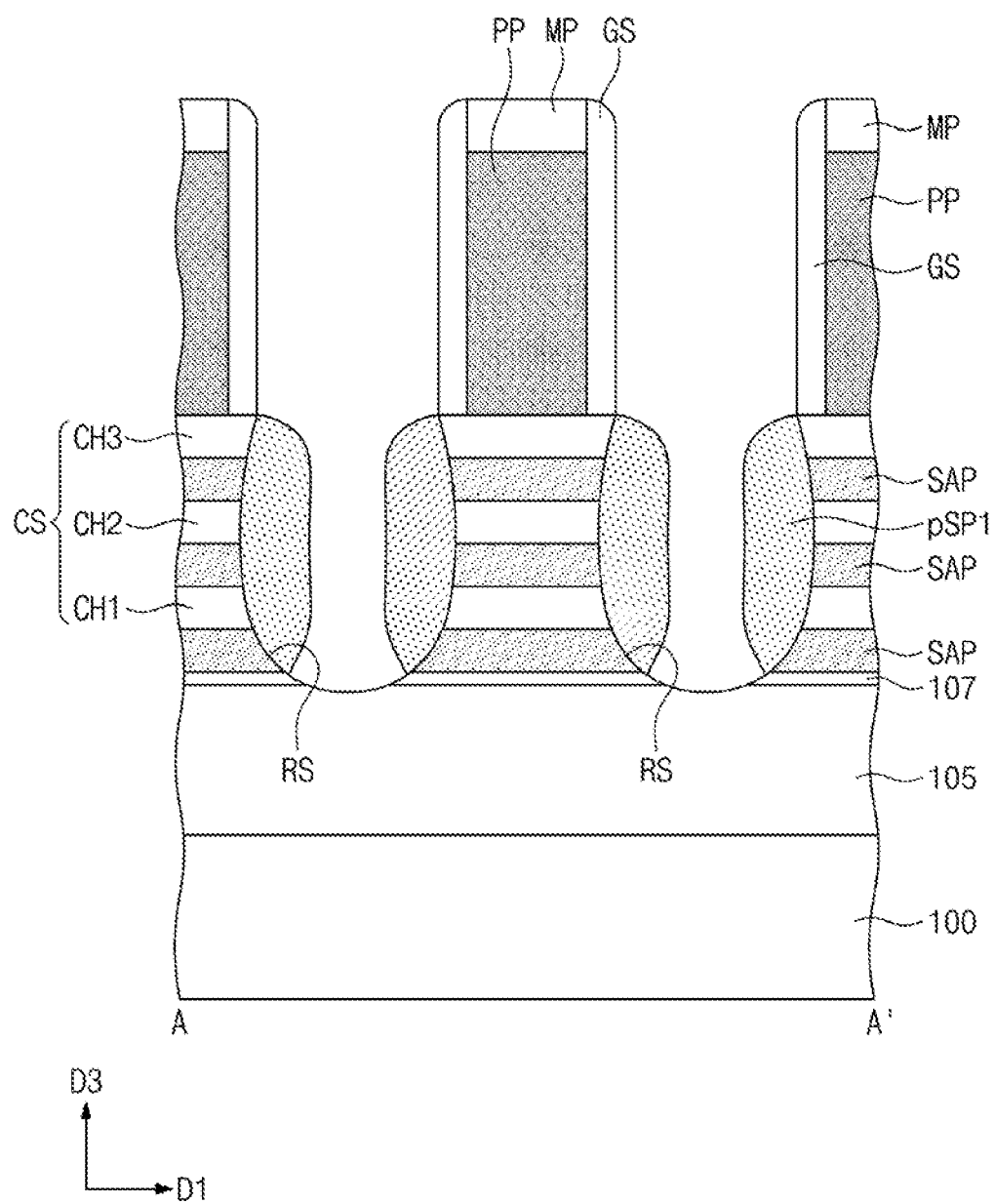
Figure 17:
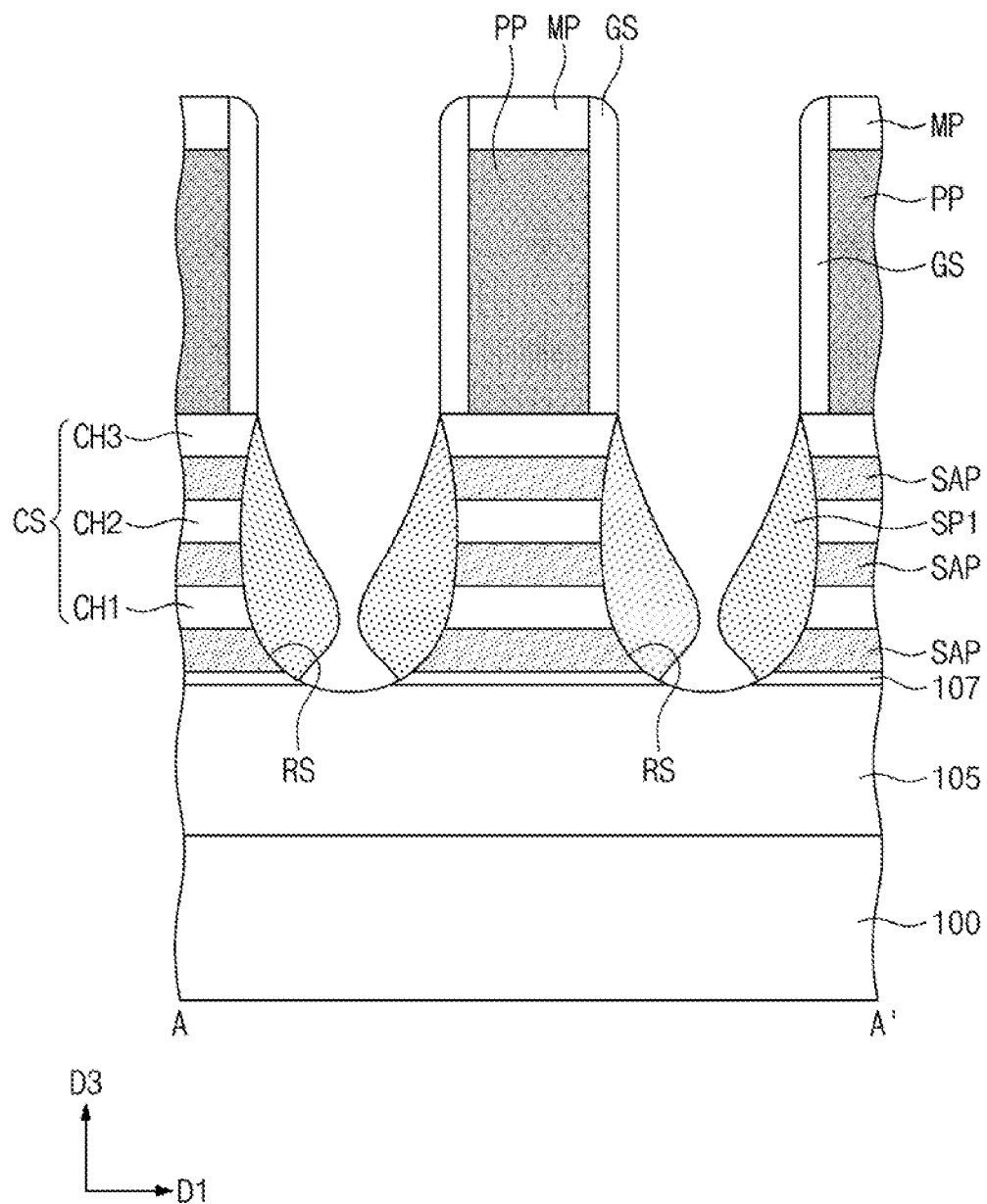
Figure 18:
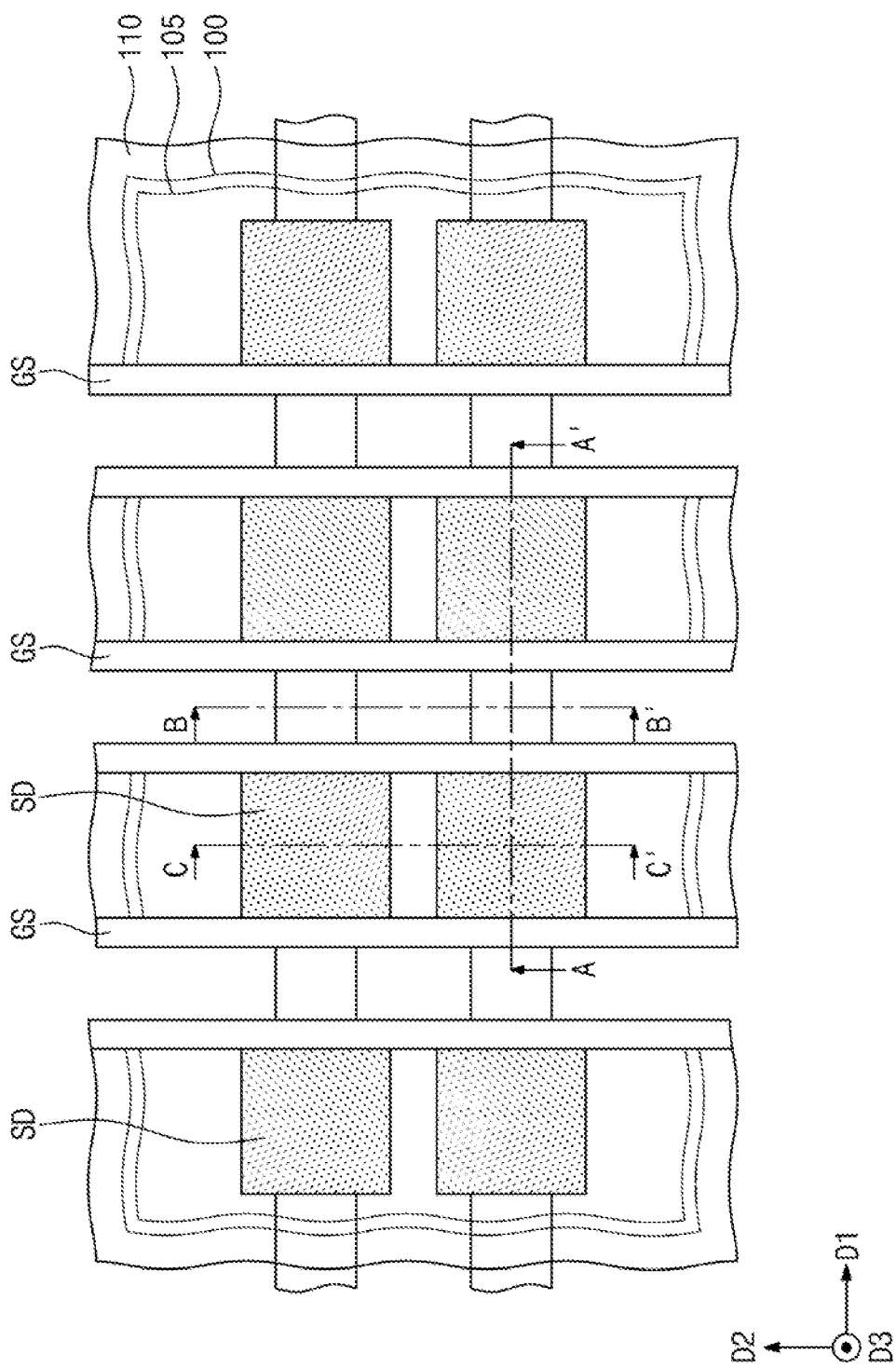
Figure 19A:
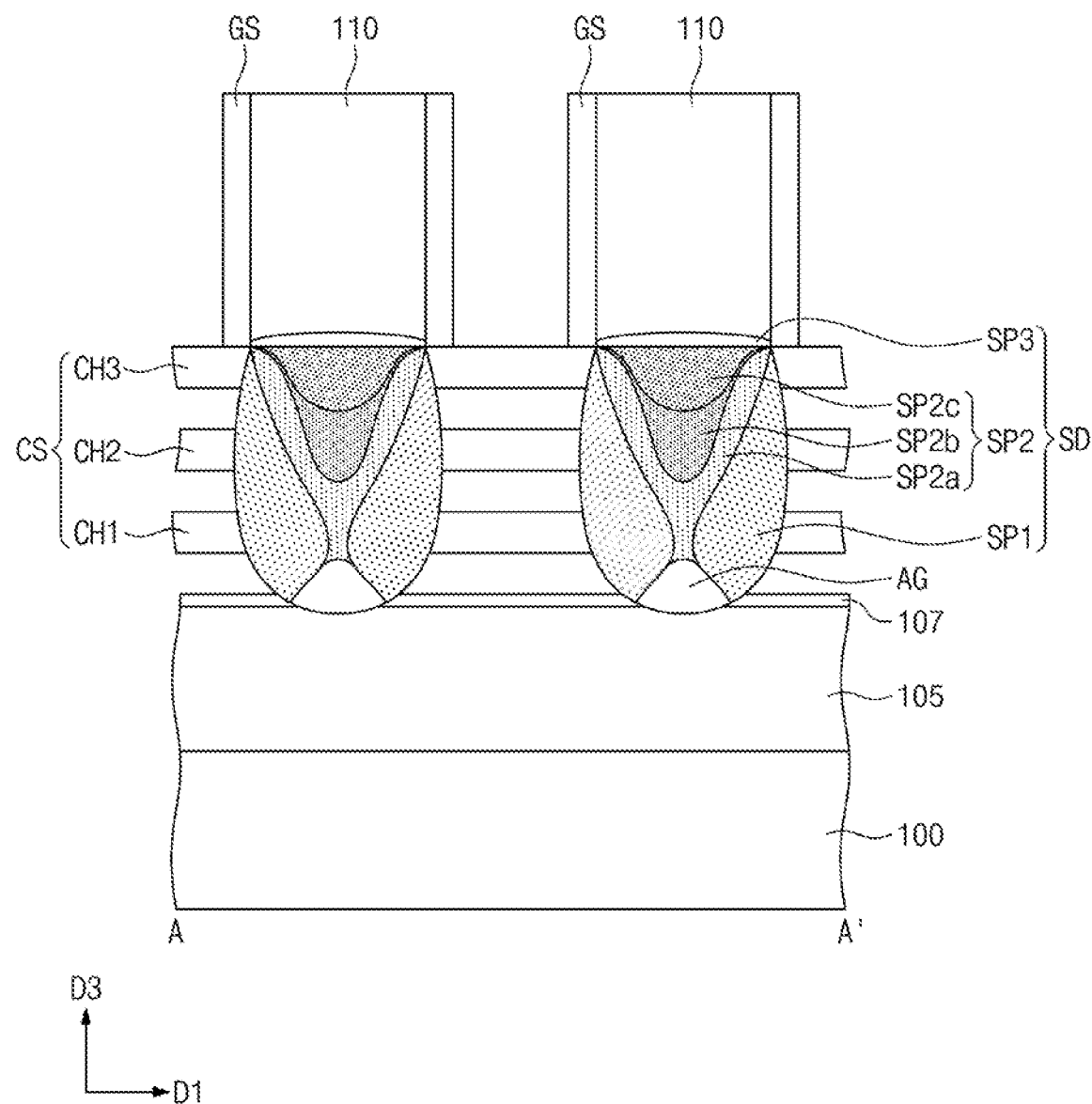
Figure 19B:
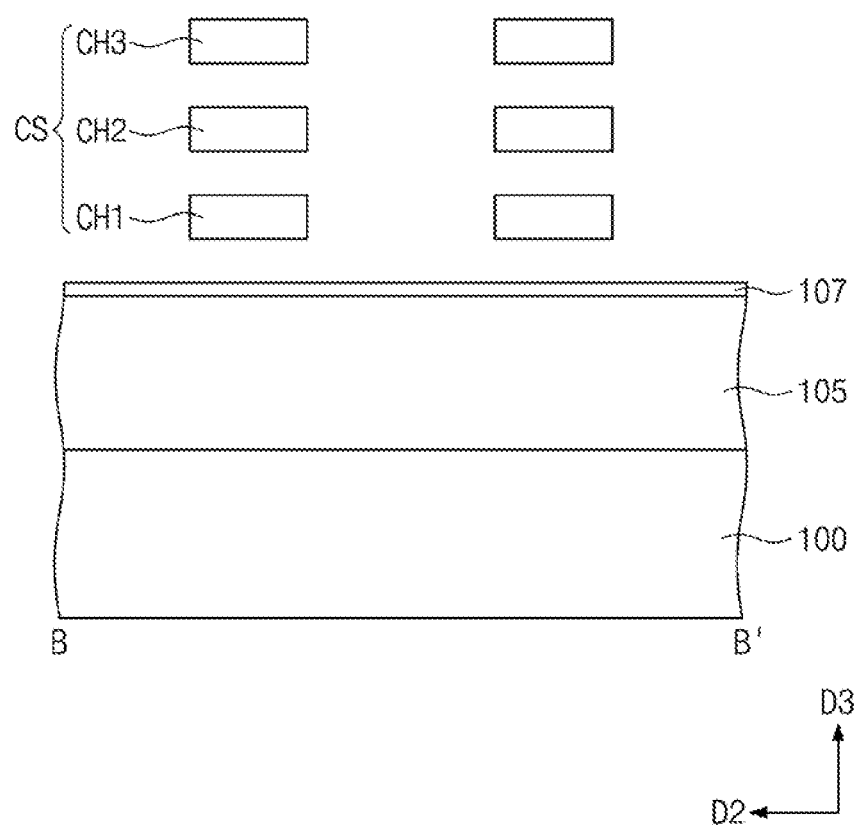
Figure 19C:
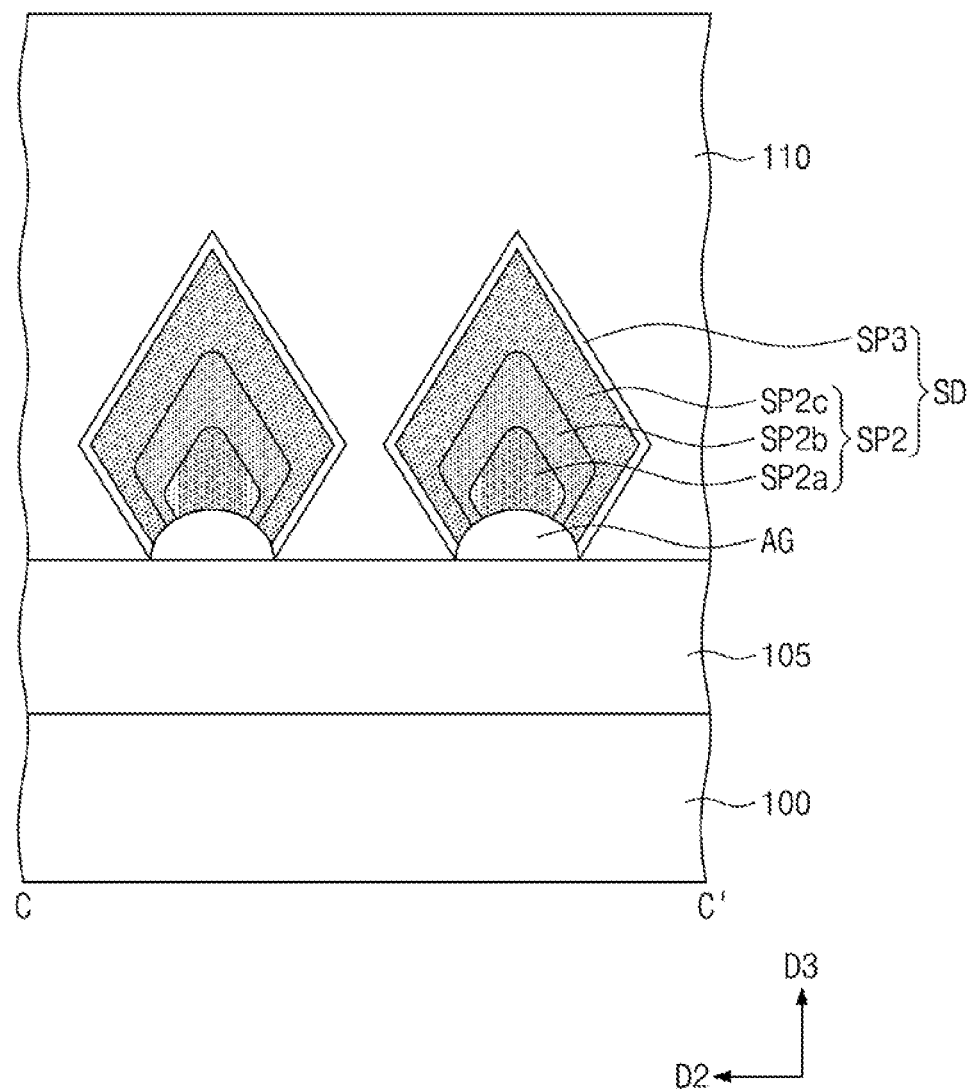
Figure 20:
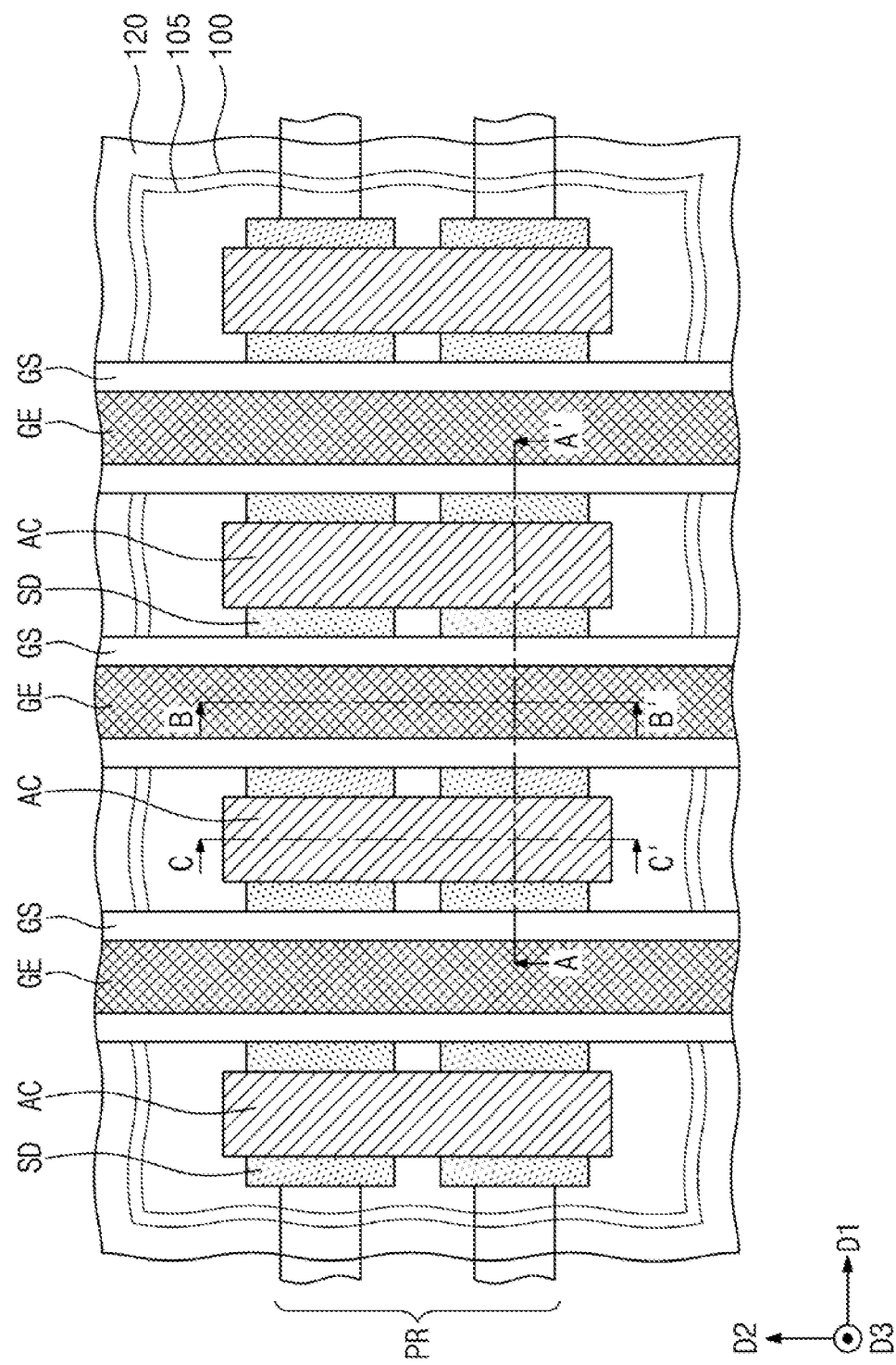
Figure 21A:
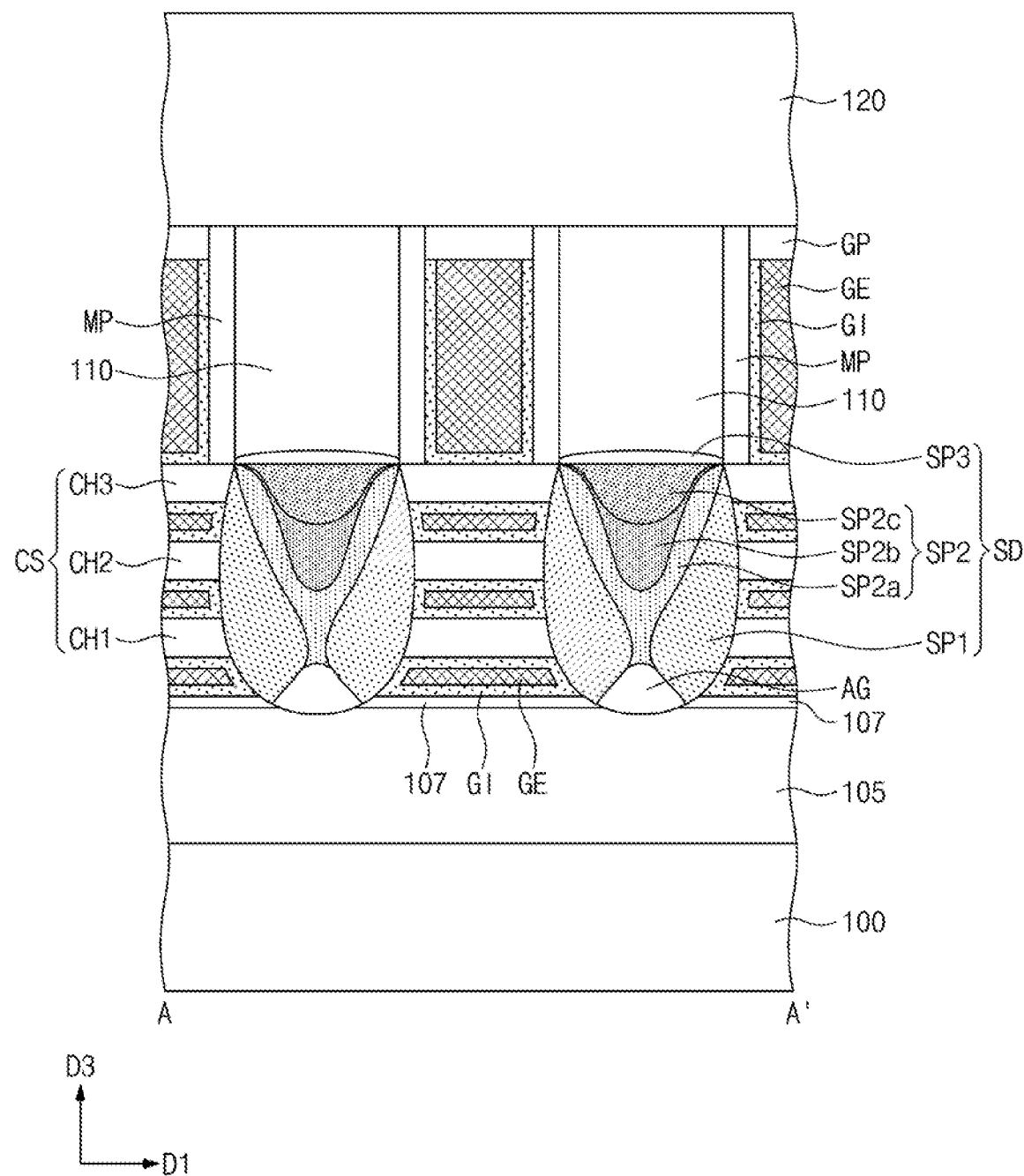
Figure 21B:
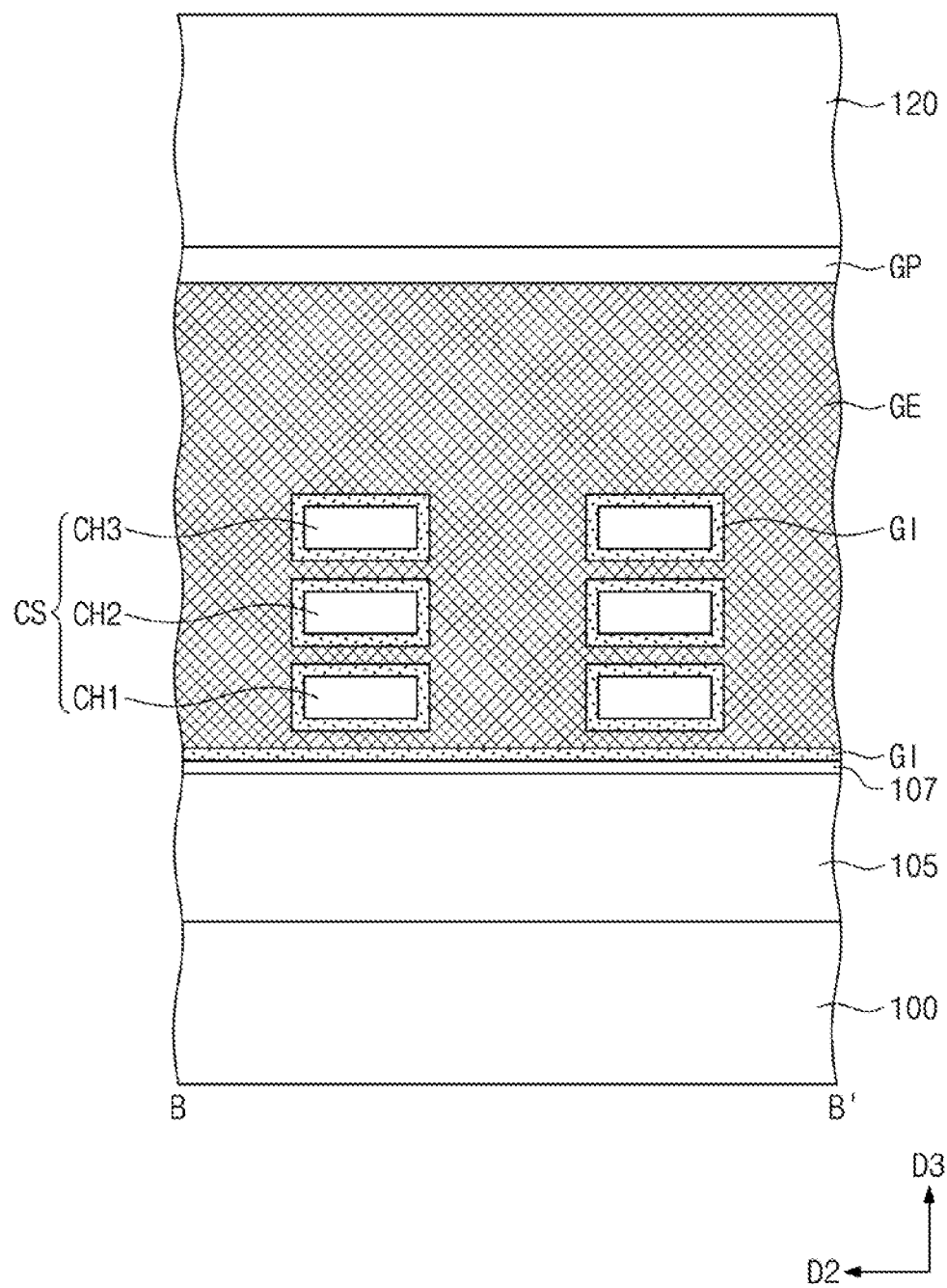
Figure 21C:
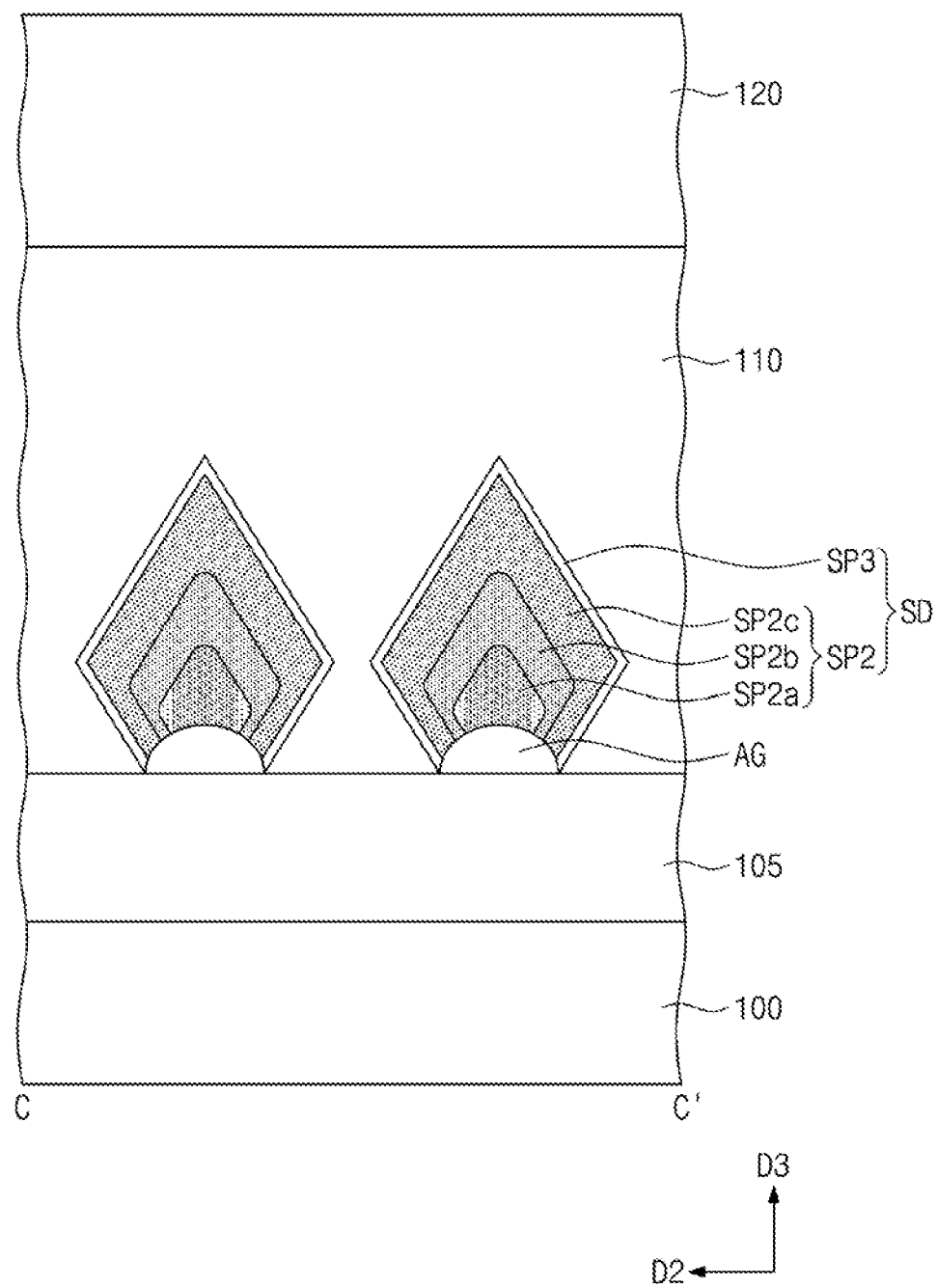

FIGS. 9, 11, 13, 18, and 20 illustrate plan views of stages in a method of fabricating a semiconductor device, according to an embodiment. FIGS. 10A, 12A, 14A, 19A, and 21A illustrate sectional views taken along lines A-A' of FIGS. 9, 11, 13, 18, and 20, respectively. FIGS. 10B, 12B, 14B, 19B, and 21B illustrate sectional views taken along lines B-B' of FIGS. 9, 11, 13, 18, and 20, respectively. FIGS. 14C, 19C, and 21C illustrate sectional views taken along lines C-C' of FIGS. 13, 18, and 20, respectively. FIGS. 15 to 17 illustrate sectional views, which are taken along a line A-A' of FIG. 13 and illustrate a method of forming source/drain patterns, according to an embodiment.

Figure 9:
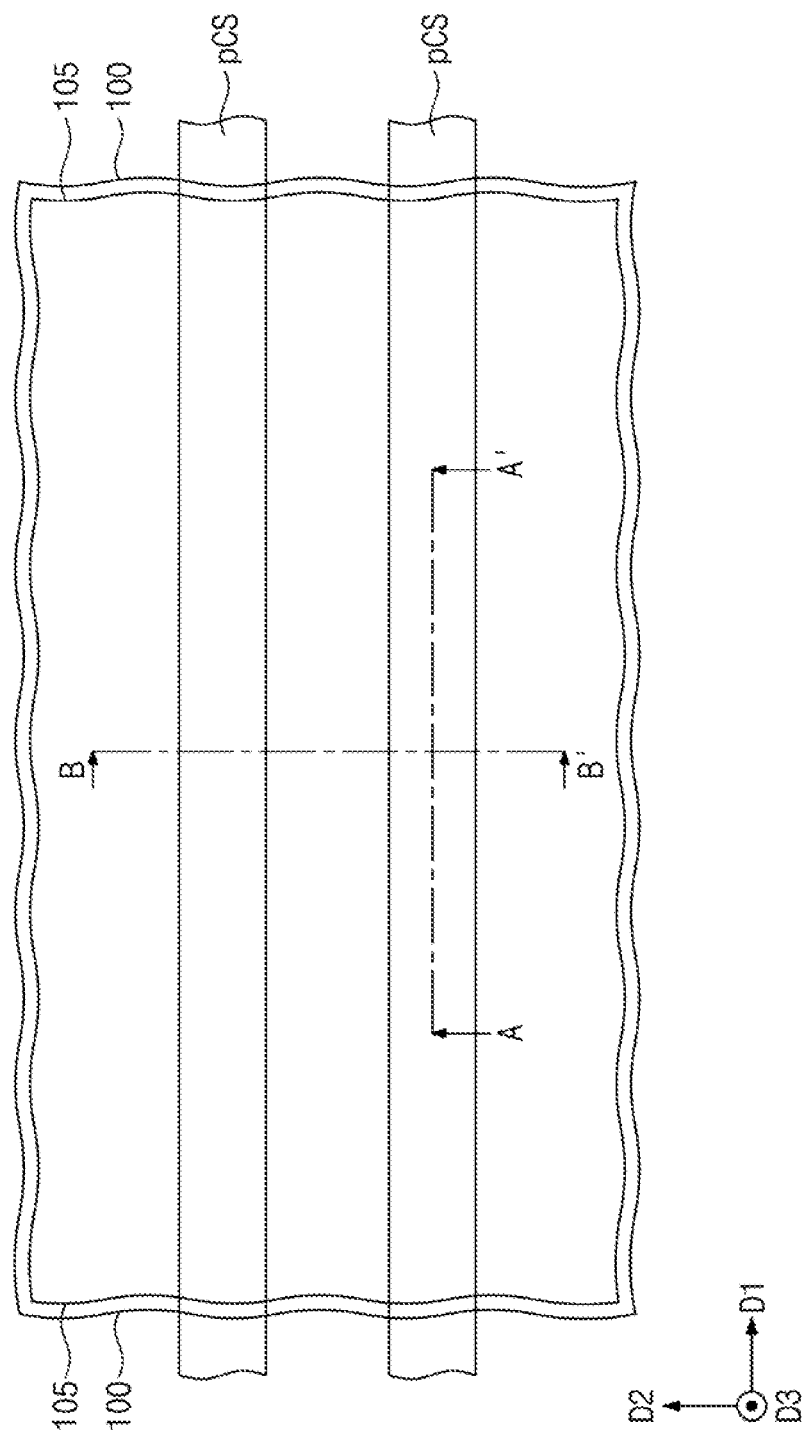
FIGS. 9, 11, 13, 18, and 20 illustrate plan views of stages in a method of fabricating a semiconductor device, according to an embodiment.
Figure 10A:
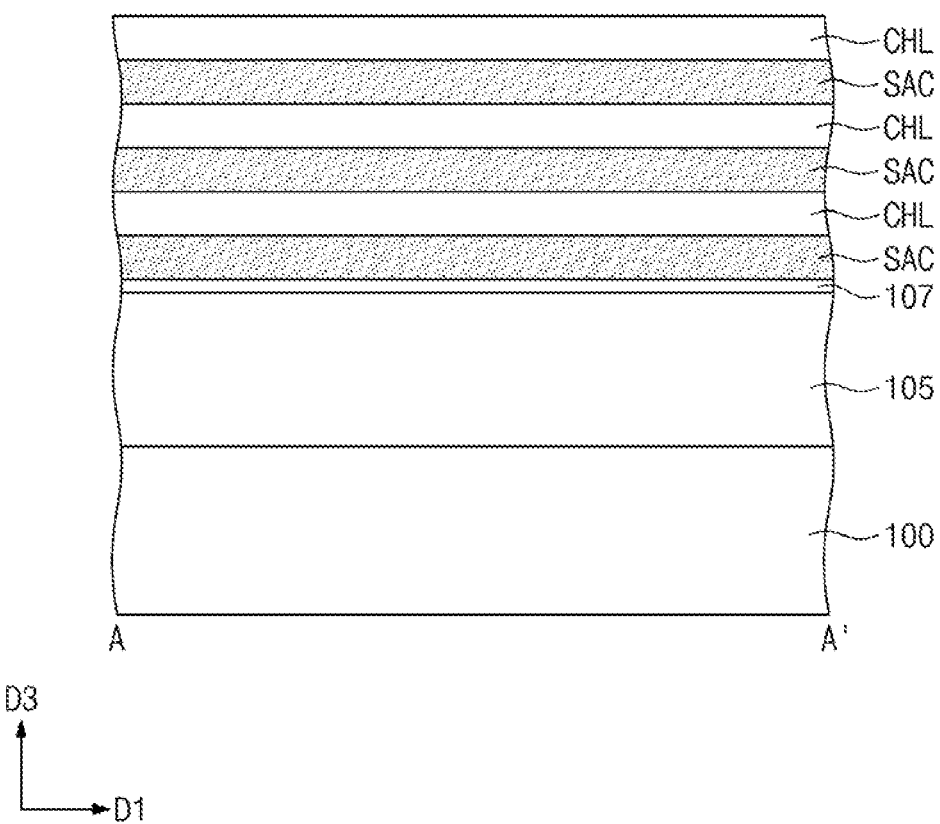
FIGS. 10A, 12A, 14A, 19A, and 21A illustrate sectional views taken along lines A-A' of FIGS. 9, 11, 13, 18, and 20, respectively.
Figure 10B:
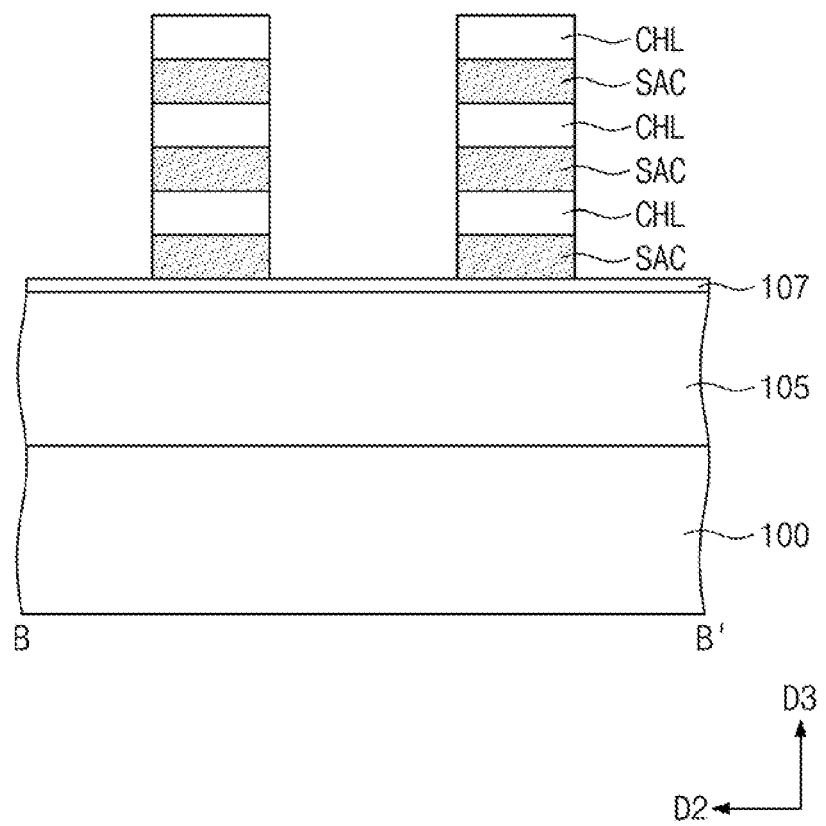
FIGS. 10B, 12B, 14B, 19B, and 21B illustrate sectional views taken along lines B-B' of FIGS. 9, 11, 13, 18, and 20, respectively.

Referring to FIGS. 9, 10A, and 10B, a SOI wafer may be prepared. The SOI wafer may include the substrate 100 and the insulating layer 105 on the substrate 100. The lower semiconductor layer 107 may be formed on the SOI wafer. The lower semiconductor layer 107 may be a seed layer, which is used to grow sacrificial layers SAC and channel semiconductor layers CHL on a top surface thereof. Thereafter, the sacrificial layers SAC and the channel semiconductor layers CHL may be alternately and repeatedly stacked on the lower semiconductor layer 107. The sacrificial layers SAC may include a material having an etch selectivity with respect to the channel semiconductor layers CHL. For example, the sacrificial layers SAC may be formed of a material, which is selected to minimize the etching of the channel semiconductor layers CHL in a process of etching the sacrificial layers SAC using a predetermined etch recipe. Such etch selectivity may be quantitatively represented in terms of a ratio of an etch rate of the sacrificial layers SAC to an etch rate of the channel semiconductor layers CHL. In an implementation, the sacrificial layers SAC may be formed of or include a material, which is selected to have a ratio in etch rate of 1:10 to 1:200 with respect to the channel semiconductor layers CHL. In an implementation, the sacrificial layers SAC may be formed of or include, e.g., SiGe, Si, or Ge, and the channel semiconductor layers CHL may be formed of or include another of, e.g., SiGe, Si, or Ge.

The sacrificial layers SAC may be formed by an epitaxial growth process, in which the lower semiconductor layer 107 or the channel semiconductor layers CHL are used as a seed layer. The channel semiconductor layers CHL may be formed by an epitaxial growth process, in which the sacrificial layers SAC are used as a seed layer. For example, the epitaxial growth process may be a chemical vapor deposition (CVD) process or a molecular beam epitaxy (MBE) process. The sacrificial layers SAC and the channel semiconductor layers CHL may be formed successively formed in the same chamber. The sacrificial layers SAC and the channel semiconductor layers CHL may be conformally grown from the entire top surface of the substrate 100, e.g., not in a selective epitaxial growth manner. In an implementation, the sacrificial layers SAC and the channel semiconductor layers CHL may be formed to have substantially the same thickness.

Next, the sacrificial layers SAC and the channel semiconductor layers CHL may be patterned to form preliminary channel stacks pCS. The preliminary channel stacks pCS may have a line or bar shape extending (e.g., lengthwise) in the first direction D1 and may be spaced apart from each other in the second direction D2. The patterning process may be an anisotropic etching process, which is performed using a mask pattern. In an implementation, the lower semiconductor layer 107 may also be patterned when the sacrificial layers SAC and the channel semiconductor layers CHL are patterned. In an implementation, unlike that shown in FIG. 10B, the lower semiconductor layer 107 may be locally left in regions below the sacrificial layers SAC and the channel semiconductor layers CHL.

Figure 11:
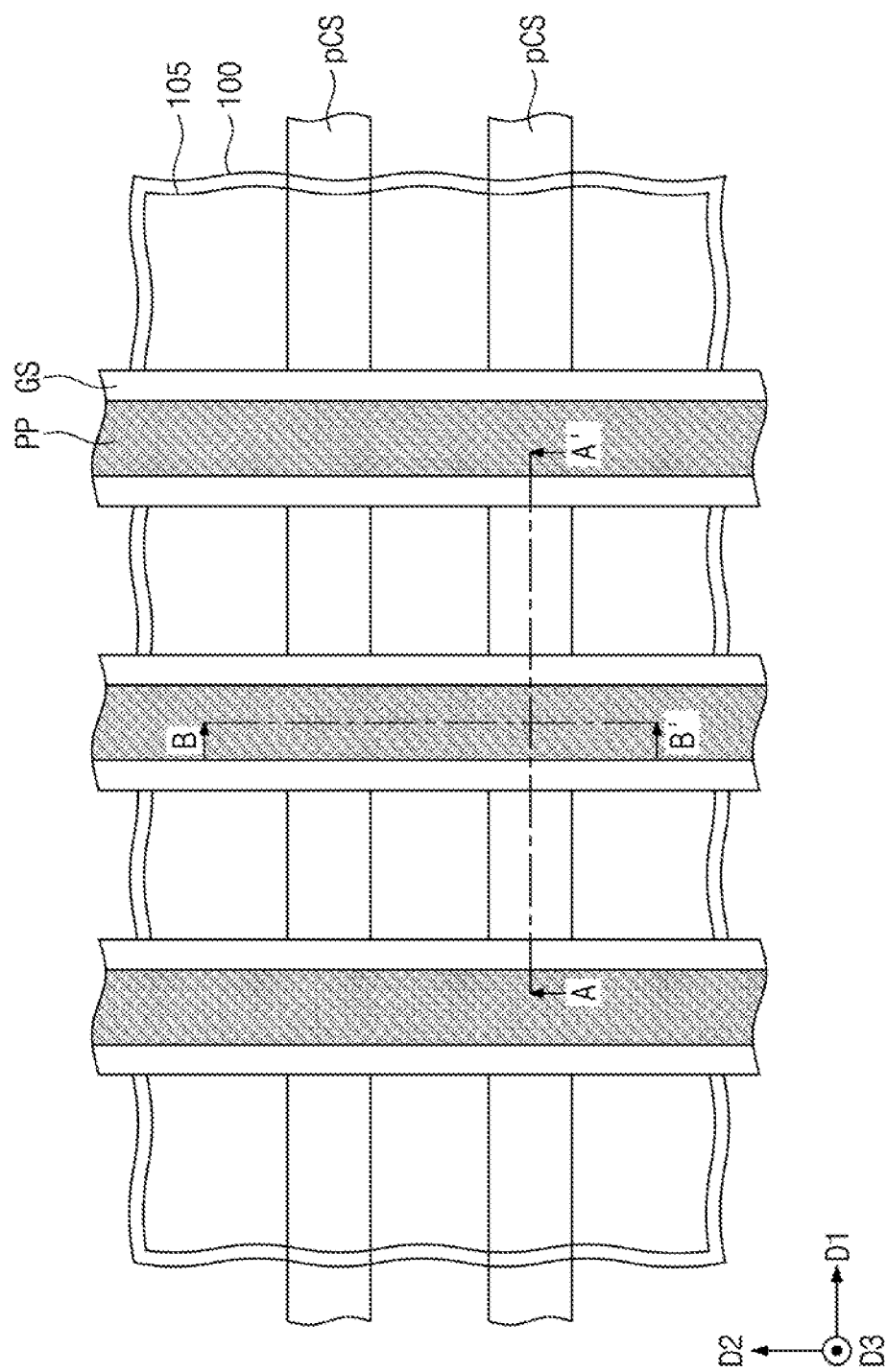
Figure 12A:
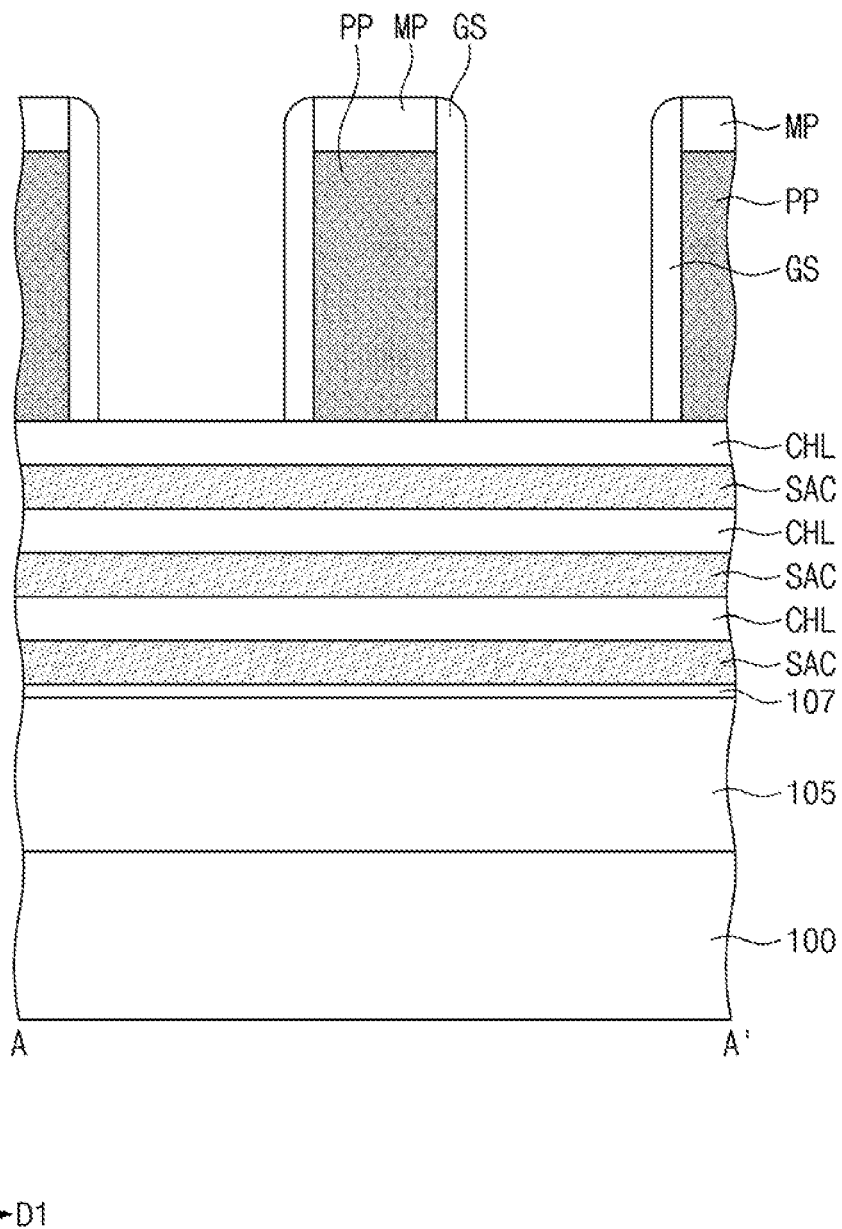
Figure 12B:
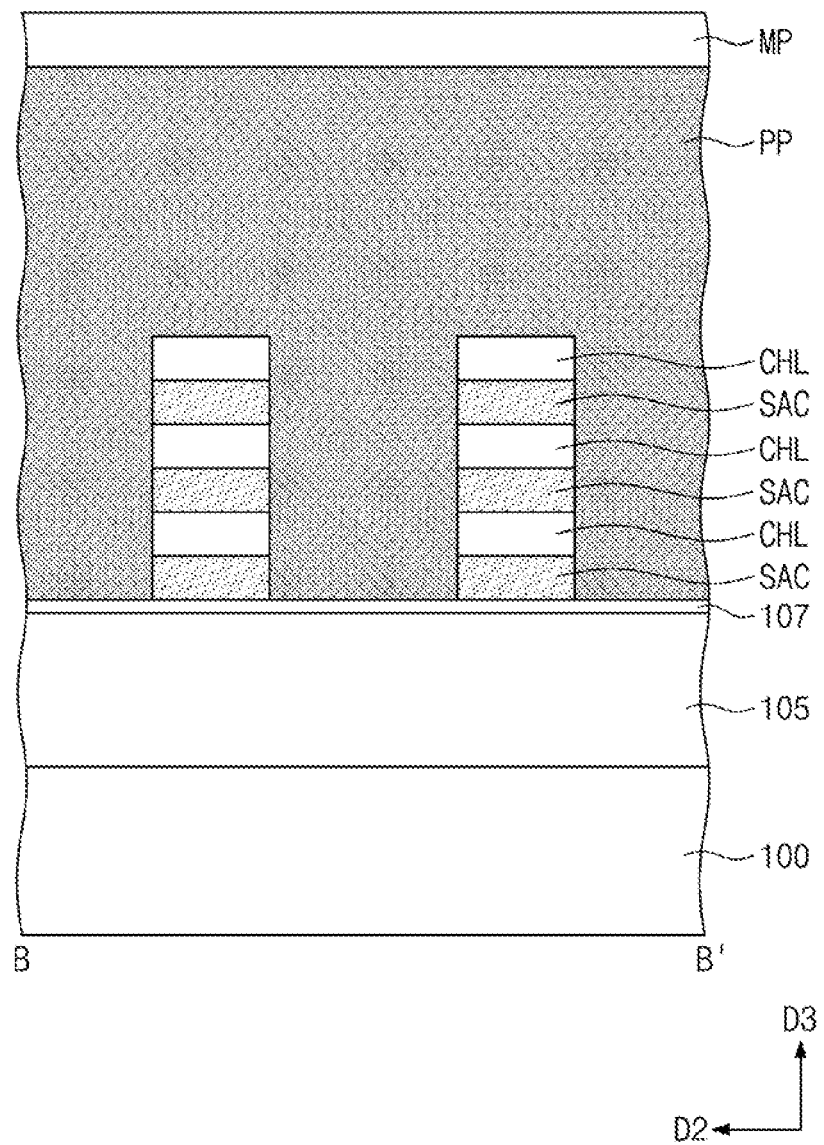
Figure 13:
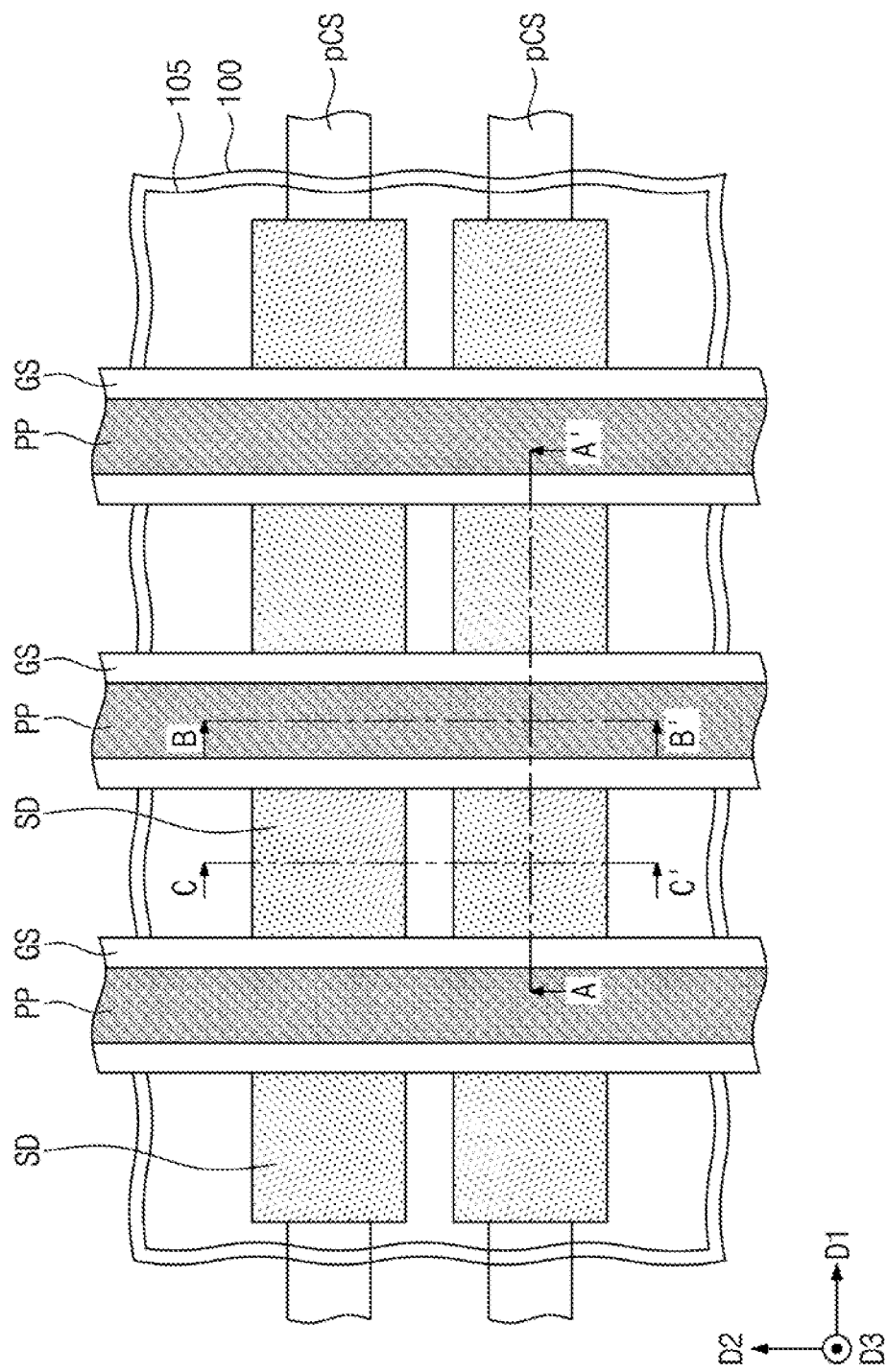

Referring to FIGS. 11, 12A, and 12B, sacrificial gate patterns PP may be formed to cross the preliminary channel stacks pCS. The sacrificial gate patterns PP may be formed to have a line or bar shape extending (e.g., lengthwise) in the second direction D2. The formation of the sacrificial gate patterns PP may include forming a sacrificial layer on the substrate 100, forming mask patterns MP on the sacrificial layer, and etching the sacrificial layer using the mask patterns MP as an etch mask. The sacrificial layer may be formed of or include, e.g., polysilicon. The mask patterns MP may be formed of or include, e.g., silicon oxide, silicon nitride, or silicon oxynitride. A pair of the gate spacers GS may be formed on opposite side surfaces of each of the sacrificial gate patterns PP. The formation of the gate spacers GS may include forming a spacer layer on the substrate 100 using a deposition process (e.g., CVD or ALD process) and performing an anisotropic etching process on the spacer layer. In an implementation, the gate spacers GS may be formed of or include, e.g., SiCN, SiCON, or SiN.

Referring to FIGS. 13 and 14A to 14C, the channel stacks CS may be formed by removing portions of the preliminary channel stacks pCS. Portions of the channel semiconductor layers CHL may be removed to form the first to third channel semiconductor patterns CH1, CH2, and CH3, which are vertically spaced apart from each other and are stacked. Portions of the sacrificial layers SAC may be removed to form sacrificial patterns SAP. The sacrificial patterns SAP and the channel semiconductor patterns CH1, CH2, and CH3 may be alternately stacked.

For example, referring further to FIG. 15, portions of the first preliminary channel stacks pCS, which are located between the sacrificial gate patterns PP, may be removed using the mask patterns MP and the gate spacers GS as an etch mask. The removal of the portions of the preliminary channel stacks pCS may be performed using an anisotropic etching process. In an implementation, the anisotropic etching process may be performed to expose the top surface of the insulating layer 105. As a result, each of the preliminary channel stacks pCS may be cut in the first direction D1 to form into the channel stacks CS, which are spaced apart from each other and are arranged in both of the first and second directions D1 and D2. In addition, recess regions RS may be formed between the channel stacks CS, which are adjacent to each other in the first direction D1. Each of the recess regions RS may be formed to have a 'U'-shaped section. For example, when measured in the first direction D1 in a sectional view, the recess regions RS may have the largest width at its intermediate level. Bottom surfaces of the recess regions RS may be located at a level, which is not higher than the top surface of the insulating layer 105, and in this case, the preliminary channel stacks pCS may be divided into a plurality of the channel stacks CS by the recess regions RS. For example, the bottom surfaces of the recess regions RS may be located at a level lower than the top surface of the insulating layer 105.

Thereafter, the source/drain regions SD may be formed in the recess regions RS, respectively. The source/drain regions SD may include the first to third semiconductor patterns SP1, SP2, and SP3, which are sequentially formed.

Referring to FIG. 16, a preliminary first semiconductor pattern pSP1 may be formed by a selective epitaxial growth process, in which the channel semiconductor patterns CH1, CH2, and CH3 exposed by first recess regions RS1 are used as a seed layer. The preliminary first semiconductor pattern pSP1 may contain a low concentration of second semiconductor elements. The first semiconductor pattern SP1 may be lightly doped with impurities in an in-situ manner. For example, the preliminary first semiconductor pattern pSP1 may include a silicon-germanium (SiGe) layer, which is doped in-situ with boron. A content of germanium (Ge) in the first semiconductor pattern SP1 may be, e.g., 5 at % to 15 at %.

The first selective epitaxial growth process may be performed under a pressure condition, which is higher than in second and third selective epitaxial growth processes to be described below. In an implementation, the first selective epitaxial growth process may be performed under a pressure of 50 Torr to 300 Torr.

Referring to FIGS. 16 and 17, a reflow process may be performed on the preliminary first semiconductor pattern pSP1 to form the first semiconductor pattern SP1. The reflow process may be performed in a hydrogen ambient (e.g., under a hydrogen atmosphere). The reflow process may be performed under a pressure condition that is lower than that for the first selective epitaxial growth process. For example, the reflow process may be performed at a pressure of about 30 Torr. The reflow process may be performed at a temperature of, e.g., 500° C. to 700° C. During the reflow process, a width of an upper portion of the preliminary first semiconductor pattern pSP1 in the first direction D1 may be reduced, and a width of a lower portion of the preliminary first semiconductor pattern pSP1 in the first direction D1 may be increased. For example, side surfaces of the sacrificial pattern SAP, which are located most adjacent to the insulating layer 105, may be thickly covered with the first semiconductor pattern SP1, and this may make it possible to prevent the lower portion of the source/drain region SD from being damaged by the subsequent process of removing the sacrificial pattern SAP.

Referring back to FIGS. 13 and 14A to 14C, the second semiconductor pattern SP2 may be formed by a second selective epitaxial growth process, in which the first semiconductor pattern SP1 is used as a seed layer. The second semiconductor pattern SP2 may be formed to have a content of the second semiconductor element that is higher than the first semiconductor pattern SP1. The second semiconductor pattern SP2 may be highly doped with impurities in an in-situ manner. The second selective epitaxial growth process may be repeated while increasing a concentration of the second semiconductor element and reducing the pressure. For example, first to third sub-semiconductor patterns SP2a, SP2b, and SP2c may be formed. In an implementation, each of the first to third sub-semiconductor patterns SP2a, SP2b, and SP2c may be formed of or include, e.g., a silicon-germanium (SiGe) layer, which is doped in-situ with boron. A content of germanium (Ge) in the second semiconductor pattern SP2 may be, e.g., 20 at % to 60 at %.

The third semiconductor pattern SP3 may be formed by a third selective epitaxial growth process, in which the second semiconductor pattern SP2 is used as a seed layer. The third semiconductor pattern SP3 may contain the same semiconductor element (e.g., the first semiconductor element) as the substrate 100. For example, the third semiconductor pattern SP3 may include single crystalline silicon (Si). The first to third selective epitaxial growth processes described above may be sequentially performed in the same chamber.

During the formation of the second semiconductor pattern SP2 and the third semiconductor pattern SP3, the air gap AG may be formed between the source/drain region SD and the insulating layer 105.

Referring to FIGS. 18 and 19A to 19C, the first interlayered insulating layer 110 may be formed on the substrate 100, and then, the first interlayered insulating layer 110 may be planarized to expose top surfaces of the sacrificial gate patterns PP. The planarization of the first interlayered insulating layer 110 may be performed using an etch-back or chemical mechanical polishing (CMP) process. All of the mask patterns MP may be removed during the planarization process. For example, the top surface of the first interlayered insulating layer 110 may be coplanar with the top surfaces of the sacrificial patterns PP and the gate spacers GS. Thereafter, the sacrificial gate patterns PP and the sacrificial patterns SAP, which are exposed, may be selectively removed.

In an implementation, in the case where the source/drain region SD is formed to be spaced apart from the insulating layer 105, the first interlayered insulating layer 110 may be formed to fill the air gap AG, as shown in FIGS. 5 to 8B.

Referring to FIGS. 20 and 21A to 21C, the gate dielectric pattern GI, the gate electrode GE, and the gate capping pattern GP may be formed in empty spaces, from which the sacrificial gate patterns PP and the sacrificial patterns SAP are removed. The gate dielectric pattern GI may be conformally formed to not completely fill the empty space with the gate dielectric pattern G. The gate dielectric pattern GI may be formed by an atomic layer deposition (ALD) process or a chemical oxidation process. As an example, the gate dielectric pattern GI may be formed of or include a high-k dielectric material. The high-k dielectric material may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may be formed by forming a gate electrode layer completely filling the remaining region of the empty space and then planarizing the gate electrode layer. As an example, the gate electrode layer may be formed of or include at a conductive metal nitride (e.g., titanium nitride or tantalum nitride) or a metallic material (e.g., titanium, tantalum, tungsten, copper, or aluminum).

Next, upper portions of the gate electrodes GE may be recessed. The gate capping patterns GP may be formed on the gate electrodes GE. The gate capping patterns GP may be formed to completely fill the recessed portions of the gate electrodes GE. The gate capping patterns GP may be formed of or include, e.g., SiON, SiCN, SiCON, or SiN.

Referring back to FIGS. 1 and 2A to 2C, the second interlayered insulating layer 120 may be formed on the first interlayered insulating layer 110 and the gate capping patterns GP. The second interlayered insulating layer 120 may be formed of or include, e.g., silicon oxide or a low-k oxide material. For example, the low-k oxide materials may include carbon-doped silicon oxide (e.g., SiCOH). The second interlayered insulating layer 120 may be formed by a CVD process.

Contact holes may be formed to penetrate the second interlayered insulating layer 120 and the first interlayered insulating layer 110 and to expose the source/drain regions SD. In an implementation, the contact holes may be self-aligned contact holes, which are self-aligned by the gate capping patterns GP and the gate spacers GS. The contacts AC may be formed in the contact holes and may be electrically connected to the source/drain regions SD.

By way of summation and review, scale-down of the MOS-FETs could lead to deterioration in operational properties of the semiconductor device. A variety of studies are being conducted to overcome technical limitations associated with the scale-down of the semiconductor device and to realize high performance semiconductor devices.

One or more embodiments may provide a semiconductor device including a field effect transistor and a method of fabricating the same.

One or more embodiments may provide a semiconductor device with improved electric characteristics and improved reliability.

According to an embodiment, a lower portion of a source/drain pattern may have a stable structure, and it may be possible to realize a semiconductor device with improved reliability. In addition, according to an embodiment, it may be possible to increase a strain exerted on a semiconductor channel pattern and thereby to realize a semiconductor device with improved electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an insulating layer on a substrate;
   channel semiconductor patterns stacked on the insulating layer and vertically spaced apart from each other;
   a gate electrode crossing the channel semiconductor patterns;

source/drain regions respectively at both sides of the gate electrode and connected to each other through the channel semiconductor patterns, the source/drain regions having concave bottom surfaces; and
air gaps between the insulating layer and the bottom surfaces of the source/drain regions.

2. The device as claimed in claim 1, wherein topmost portions of the air gaps are located at a level lower than a bottom surface of a bottommost one of the channel semiconductor patterns closest to the insulating layer.

3. The device as claimed in claim 1, wherein bottommost portions of the air gaps are located at a level lower than a topmost surface of the insulating layer.

4. The device as claimed in claim 1, wherein:
the source/drain regions are spaced apart from each other in a first direction,
each of the source/drain regions includes a pair of first semiconductor patterns, which are spaced apart from each other in the first direction, and
the first semiconductor patterns have lower portions and upper portions, widths of the lower portions in the first direction being larger than widths of the upper portions in the first direction.

5. The device as claimed in claim 1, wherein:
the source/drain regions are spaced apart from each other in a first direction, and
each of the source/drain regions includes:
a pair of first semiconductor patterns, which are spaced apart from each other in the first direction, and
a second semiconductor pattern on the pair of first semiconductor patterns and connecting the pair of first semiconductor patterns.

6. The device as claimed in claim 5, wherein:
the channel semiconductor patterns include a first semiconductor element,
each of the first semiconductor patterns and the second semiconductor pattern include a second semiconductor element, a lattice constant of the second semiconductor element being greater than a lattice constant of the first semiconductor element, and
a content of the second semiconductor element in the second semiconductor pattern is higher than a content of the second semiconductor element in each first semiconductor pattern.

7. The device as claimed in claim 5, wherein topmost portions of the air gaps are defined by a bottom surface of each second semiconductor pattern.

8. The device as claimed in claim 1, wherein:
the channel semiconductor patterns include a first semiconductor element,
the source/drain regions include the first semiconductor element and a second semiconductor element, a lattice constant of the second semiconductor element being greater than a lattice constant of the first semiconductor element, and
a content of the second semiconductor element in the source/drain regions decreases with decreasing distance from the insulating layer.

9. The device as claimed in claim 1, wherein:
the source/drain regions are spaced apart from each other in a first direction,
each of the source/drain regions includes a pair of first semiconductor patterns spaced apart from each other in the first direction, and
bottommost portions of the first semiconductor patterns are located at a level lower than a topmost surface of the insulating layer.

10. The device as claimed in claim 1, wherein:
the source/drain regions include:
a first semiconductor pattern covering side surfaces of the channel semiconductor patterns, and
a second semiconductor pattern on the first semiconductor pattern, and
the air gaps are defined by a bottom surface of the first semiconductor pattern, a bottom surface of the second semiconductor pattern, and a top surface of the insulating layer.

11. A semiconductor device, comprising:
an insulating layer on a substrate;
a first channel semiconductor pattern on the insulating layer and at a first vertical level;
a second channel semiconductor pattern stacked on the first channel semiconductor pattern and located at a second vertical level higher than the first vertical level;
a gate electrode crossing the first channel semiconductor pattern and the second channel semiconductor pattern; and
a source/drain region on a side surface of the gate electrode and connected to the first channel semiconductor pattern and the second channel semiconductor pattern,
wherein:
the source/drain region includes:
a first semiconductor pattern covering side surfaces of the first channel semiconductor pattern and the second channel semiconductor pattern, and
a second semiconductor pattern on the first semiconductor pattern, and
a width of the first semiconductor pattern at the first vertical level is larger than a width of the first semiconductor pattern at the second vertical level.

12. The device as claimed in claim 11, wherein:
each of the first channel semiconductor pattern and the second channel semiconductor pattern includes a first semiconductor element and a second semiconductor element,
a lattice constant of the second semiconductor element is greater than a lattice constant of the first semiconductor element, and
a content of the second semiconductor element in the second semiconductor pattern is higher than a content of the second semiconductor element in the first semiconductor pattern.

13. The device as claimed in claim 11, wherein a bottommost portion of the first semiconductor pattern is located at a level lower than a topmost surface of the insulating layer.

14. The device as claimed in claim 11, further comprising an air gap between a bottom surface of the source/drain region and a top surface of the insulating layer.

15. The device as claimed in claim 14, wherein a topmost portion of the air gap is located at a level lower than a bottom surface of the first channel semiconductor pattern.

16. A semiconductor device, comprising:
an insulating layer on a substrate;
a first channel stack on the insulating layer;
a second channel stack on the insulating layer and spaced apart from the first channel stack in a first direction, each of the first channel stack and the second channel stack including channel semiconductor patterns stacked to be vertically spaced apart from each other; and
a source/drain region between the first channel stack and the second channel stack,
wherein the source/drain region includes:
a pair of first semiconductor patterns covering side surfaces of the channel semiconductor patterns of the first channel stack and side surfaces of the channel semiconductor patterns of the second channel stack and being spaced apart from each other in the first direction, and second semiconductor patterns on the pair of first semiconductor patterns and connecting the pair of first semiconductor patterns to each other.

17. The device as claimed in claim 16, wherein the pair of first semiconductor patterns each include a protruding portion, the protruding portion of one first semiconductor pattern protruding toward the protruding portion of another first semiconductor pattern.

18. The device as claimed in claim 16, further comprising an air gap between a bottom surface of the source/drain region and a top surface of the insulating layer.

19. The device as claimed in claim 18, wherein a topmost portion of the air gap is located at a level lower than a bottom surface of a lowermost one of the channel semiconductor patterns of the first channel stack and the second channel stack.

20. The device as claimed in claim 18, wherein a bottommost portion of the air gap is located at a level lower than a topmost surface of the insulating layer.

* * * * *